(12) United States Patent
Nagai et al.

(10) Patent No.: US 10,847,522 B2
(45) Date of Patent: Nov. 24, 2020

(54) SEMICONDUCTOR DEVICE AND FABRICATION METHOD

(71) Applicant: FUJITSU SEMICONDUCTOR LIMITED, Yokohama (JP)

(72) Inventors: Kouichi Nagai, Kuwana (JP); Ko Nakamura, Aizuwakamatsu (JP); Mitsuhiro Nakamura, Aizuwakamatsu (JP); Akio Ito, Kawasaki (JP)

(73) Assignee: FUJITSU SEMICONDUCTOR MEMORY SOLUTION LIMITED, Yokohama (JP)

( * ) Notice: Subject to any disclaimer, the term of this patent is extended or adjusted under 35 U.S.C. 154(b) by 22 days.

(21) Appl. No.: 16/238,854

(22) Filed: Jan. 3, 2019

(65) Prior Publication Data

US 2019/0237471 A1 Aug. 1, 2019

(30) Foreign Application Priority Data

Jan. 31, 2018 (JP) ................................ 2018-015193

(51) Int. Cl.
*H01L 27/11507* (2017.01)
*H01L 23/52* (2006.01)
(Continued)

(52) U.S. Cl.
CPC ........ *H01L 27/11507* (2013.01); *H01L 23/52* (2013.01); *H01L 23/564* (2013.01); *H01L 28/57* (2013.01)

(58) Field of Classification Search
CPC ......... H01L 27/11507; H01L 27/11509; H01L 27/1159; H01L 11/11585; H01L 23/52; H01L 23/564; H01L 28/57
See application file for complete search history.

(56) References Cited

U.S. PATENT DOCUMENTS 3,607,697 A * 9/1971 Shim ................... C23C 14/0084
204/192.23
2005/0207202 A1 9/2005 Kumura et al.
(Continued)

FOREIGN PATENT DOCUMENTS

JP 2005-268478 A 9/2005

OTHER PUBLICATIONS

Nemanic "Hydrogen permeation barriers: Basic requirements, materials selection, deposition methods, and quality evaluation", Nuclear Materials and Energy 19 (2019) 451-457, Elsevier (Year: 2019).*

(Continued)

*Primary Examiner* — Sitaramarao S Yechuri
(74) *Attorney, Agent, or Firm* — Westerman, Hattori, Daniels & Adrian, LLP

(57) ABSTRACT

A semiconductor device includes a substrate; a transistor formed on a surface of the substrate; a first insulating film formed above the transistor; a second semiconductor film formed on the first semiconductor film; a third semiconductor film formed on the second semiconductor film; a fourth semiconductor film formed on the third semiconductor film; and a ferroelectric capacitor formed on the fourth insulating film, wherein a hydrogen permeability of the third insulating film is higher than a hydrogen permeability of the first insulating film, and a hydrogen permeability and an oxygen permeability of the second insulating film and of the fourth insulating film are higher than the hydrogen permeability and an oxygen permeability of the first insulating film and of the third insulating film.

12 Claims, 37 Drawing Sheets

(51) Int. Cl.
*H01L 23/00* (2006.01)
*H01L 49/02* (2006.01)

(56) References Cited

U.S. PATENT DOCUMENTS

| | | | | |
|---|---|---|---|---|
| 2006/0170019 A1* | 8/2006 | Ozaki | ................... | H01L 27/105 |
| | | | | 257/295 |
| 2006/0278954 A1* | 12/2006 | Izumi | ................... | C23C 16/401 |
| | | | | 257/532 |
| 2010/0052021 A1* | 3/2010 | Mocho | ............. | H01L 27/11509 |
| | | | | 257/295 |
| 2010/0330769 A1* | 12/2010 | Yamakawa | .............. | H01G 4/33 |
| | | | | 438/381 |
| 2017/0040460 A1* | 2/2017 | Liu | .................... | H01L 27/1248 |

OTHER PUBLICATIONS

Nemanic et. al. "Hydrogen permeation through silicon nitride films", Journal of Alloys and Compounds 539 (2012) 184-189, Elsevier (Year: 2012).*

* cited by examiner

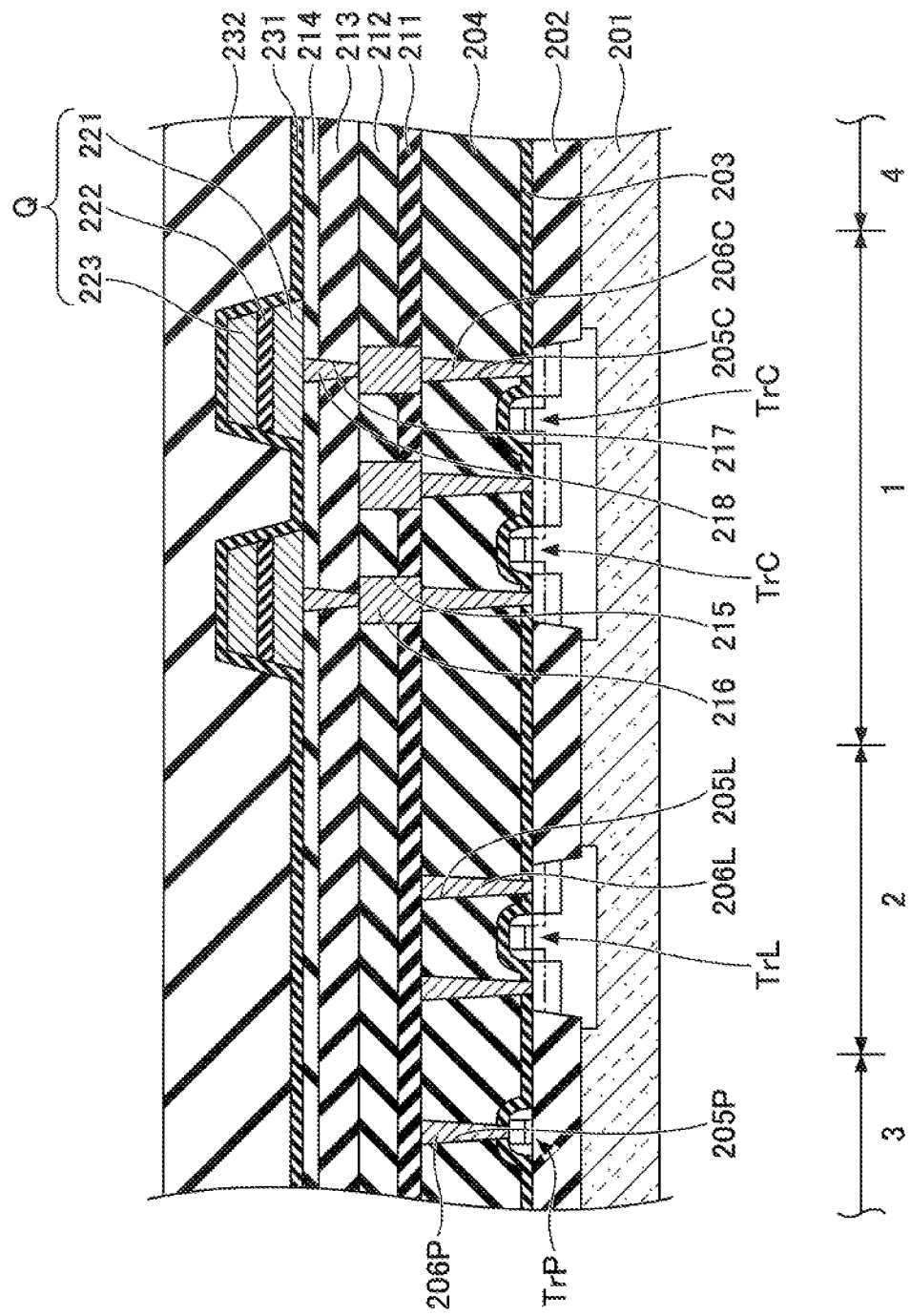

SEMICONDUCTOR DEVICE AND FABRICATION METHOD

CROSS-REFERENCE TO RELATED APPLICATIONS

This application is based on and claims priority to Japanese Patent Application No. 2018-015193, filed on Jan. 31, 2018, the entire contents of which are incorporated herein by reference.

FIELD

The disclosures discussed herein relate to a semiconductor device and a fabrication method.

BACKGROUND

Development of ferroelectric random access memory (FeRAM) utilizing polarization reversal of ferroelectric memory to retain information in ferroelectric capacitors has recently been advanced. FeRAM is a nonvolatile memory configured to retain information even when power supply is off. Such ferroelectric memory exhibits high integration, high speed driving, high durability, and low power consumption properties.

Ferroelectric oxides having a perovskite crystal structure with remanent polarization of approximately 10 $\mu C/cm^2$ to 30 $\mu C/cm$ are mainly used as a material of a ferroelectric film for forming a ferroelectric capacitor; examples of the ferroelectric oxides include PZT ($Pb(Zr, Ti)O_3$) and SBT ($SrBi_2Ta_2O_9$). The ferroelectric properties of the ferroelectric oxides tend to be degraded by moisture intruded from an interlayer insulating film such as a silicon oxide film having high affinity with water. That is, moisture contained in the interlayer insulating film is decomposed into hydrogen and oxygen during a high temperature process of forming an interlayer insulating film or of forming a metal wiring after formation of a ferroelectric capacitor. Hydrogen thus reacts with oxygen in ferroelectric oxides to cause oxygen deficiency in the ferroelectric film, which degrades the crystallinity of the ferroelectric film. The oxygen deficiency due to moisture contained in the interlayer insulating film may occur not only during a high temperature process but may also occur through long term use of ferroelectric memory. The degradation in the crystallinity of the ferroelectric film will cause deterioration of a ferroelectric capacitor.

Thus, various studies have been conducted in the related art on the structure of a ferroelectric film in order to lower hydrogen intrusion into a ferroelectric film. For example, a structure having ferroelectric capacitors that are directly covered with an aluminum oxide film from upper sides and lateral sides is known in the art. Further, a structure having a silicon nitride film formed on the surface of a semiconductor substrate and provided between the semiconductor substrate and a transistor connected to ferroelectric capacitors is known in the art. The aluminum oxide film and the silicon nitride film are not readily permeated by hydrogen and moisture. Further, a structure having a guard ring provided around a memory cell portion that includes multiple ferroelectric capacitors is also known in the art.

RELATED-ART DOCUMENT

Patent Document

Patent Document 1: Japanese Laid-open Patent Publication No. 2005-268478

SUMMARY

According to an aspect of an embodiment, a semiconductor device includes:
a substrate;
a transistor formed on a surface of the substrate;
a first insulating film formed above the transistor;
a second semiconductor film formed on the first semiconductor film;
a third semiconductor film formed on the second semiconductor film;
a fourth semiconductor film formed on the third semiconductor film; and a ferroelectric capacitor formed on the fourth insulating film, wherein a hydrogen permeability of the third insulating film is higher than a hydrogen permeability of the first insulating film, and wherein a hydrogen permeability and an oxygen permeability of the second insulating film and of the fourth insulating film are higher than the hydrogen permeability and an oxygen permeability of the first insulating film and of the third insulating film.

According to another aspect of an embodiment, a method for fabricating a semiconductor device includes forming a transistor on a surface of a substrate;
forming a first insulating film above the transistor;
forming a second insulating film on the first insulating film, a hydrogen permeability and an oxygen permeability of the second insulating film being than a hydrogen permeability and an oxygen permeability of the first insulating film; forming a third insulating film on the second insulating film, a hydrogen permeability of the third insulating film being higher than the hydrogen permeability of the first insulating film, and the hydrogen permeability and an oxygen permeability of the third insulating film being lower than the hydrogen permeability and the oxygen permeability of the second insulating film; forming a fourth insulating film on the third insulating film, the fourth insulating film having the hydrogen permeability and the oxygen permeability higher than the hydrogen permeability and the oxygen permeability of the first insulating film and of the third insulating film;
forming a ferroelectric capacitor on the fourth insulating film; and performing annealing to desorb hydrogen contained in the second insulating film and the fourth insulating film.

The object and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF THE DRAWINGS

FIG. 8O is a cross-sectional view (part 15) illustrating the method for fabricating a semiconductor device according to the second embodiment;

FIG. 8R is a cross-sectional view (part 18) illustrating the method for fabricating a semiconductor device according to the second embodiment;

DESCRIPTION OF EMBODIMENTS

The above-described related art technologies will not sufficiently lower deterioration of a ferroelectric capacitor due to hydrogen.

Accordingly, it is an object of the present invention to provide a semiconductor device and a fabrication method thereof that are capable of further lowering deterioration of a ferroelectric capacitor due to hydrogen.

The following illustrates specific embodiments with reference to the accompanying drawings.

First Embodiment

Figure 1:
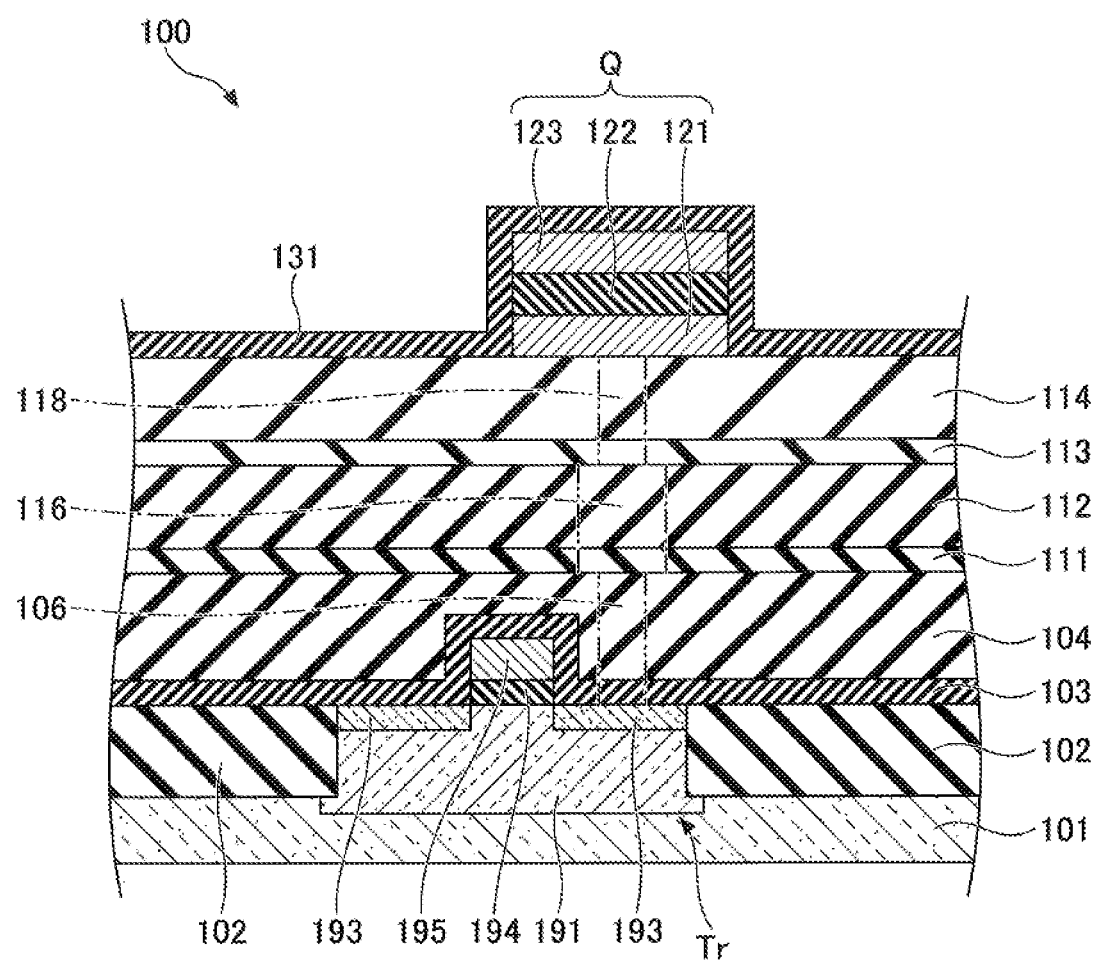
FIG. 1 is a cross-sectional view illustrating a semiconductor device according to a first embodiment.

First, a first embodiment will be described. FIG. 1 is a cross-sectional view illustrating a semiconductor device according to a first embodiment.

As illustrated in FIG. 1, a semiconductor device 100 according to the first embodiment includes a substrate 101 and a transistor Tr formed on a surface of the substrate 101. The semiconductor device 100 further includes a first insulating film 111 formed above a transistor Tr, a second insulating film 112 formed on the first insulating film 111, a third insulating film 113 formed on the second insulating film 112, and a fourth insulating film 114 formed on the third insulating film 113. The semiconductor device 100 further includes a ferroelectric capacitor Q formed on the fourth insulating film 114. A hydrogen permeability of the third insulating film 113 is higher than a hydrogen permeability of the first insulating film 111, and a hydrogen permeability and an oxygen permeability of the second insulating film 112 and of the fourth insulating film 114 are higher than the hydrogen permeability and an oxygen permeability of the first insulating film 111 and of the third insulating film 113.

An element isolation insulating film 102 configured to define an element region is formed on the surface of the substrate 101, and the transistor Tr is formed in the element region. The transistor Tr includes, for example, a first conductivity type well 191, a second conductivity type impurity diffusion layer 193, a gate insulating film 194, and a gate electrode 195. An insulating film 103 is formed to cover the transistor Tr on the substrate 101, and an insulating film 104 is formed on the insulating film 103.

The ferroelectric capacitor Q includes a lower electrode 121, a ferroelectric film 122, and an upper electrode 123. A fifth insulating film 131 is formed on the fourth insulating film 114 so as to cover an upper surface and side surfaces of the ferroelectric capacitor Q. A hydrogen permeability of the fifth insulating film 131 is lower than hydrogen permeability of the third insulating film 113 and an oxygen permeability of the fifth insulating film 131 is lower than the oxygen permeability of the second insulating film 112 and of the fourth insulating film 114.

A first conductor 116 may be formed in the first insulating film 111 and the second insulating film 112, a second conductor 118 may be formed in the third insulating film 113 and the fourth insulating film 114, and a third conductor 106 may be formed in the insulating film 103 and the insulating film 104. The second conductor 118 is connected to the first conductor 116 and the ferroelectric capacitor Q, and the third conductor 106 is in contact with a lower surface of the first conductor 116 and is connected to the transistor Tr.

Next, a method for fabricating the semiconductor device 100 according to the first embodiment will be described. FIGS. 2A to 2E are cross-sectional views illustrating a fabrication method of the semiconductor device 100 according to the first embodiment in order of steps.

Figure 2A:
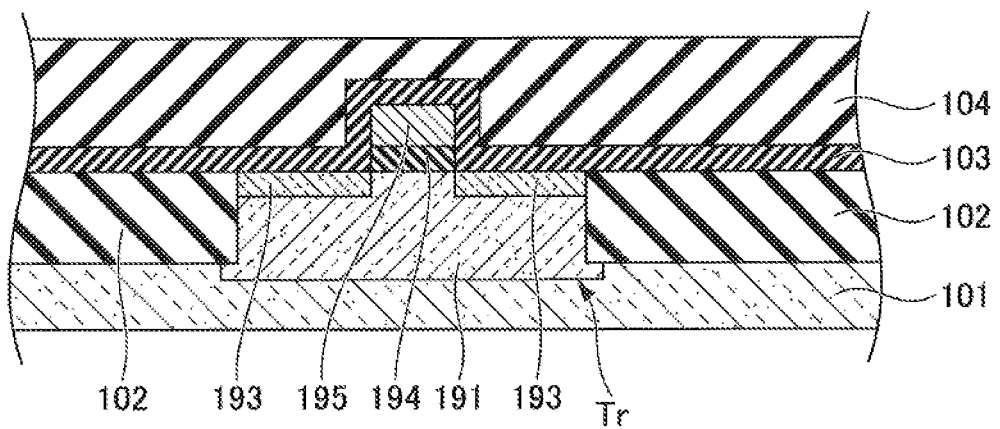
FIG. 2A is a cross-sectional view (part 1) illustrating a method for fabricating a semiconductor device according to the first embodiment.

First, as illustrated in FIG. 2A, an element isolation insulating film 102 is formed on a surface of a substrate 101. Subsequently, a transistor Tr is formed in an element region. Thereafter, an insulating film 103 is formed to cover the transistor Tr, and an insulating film 104 is formed on the insulating film 103.

Figure 2B:
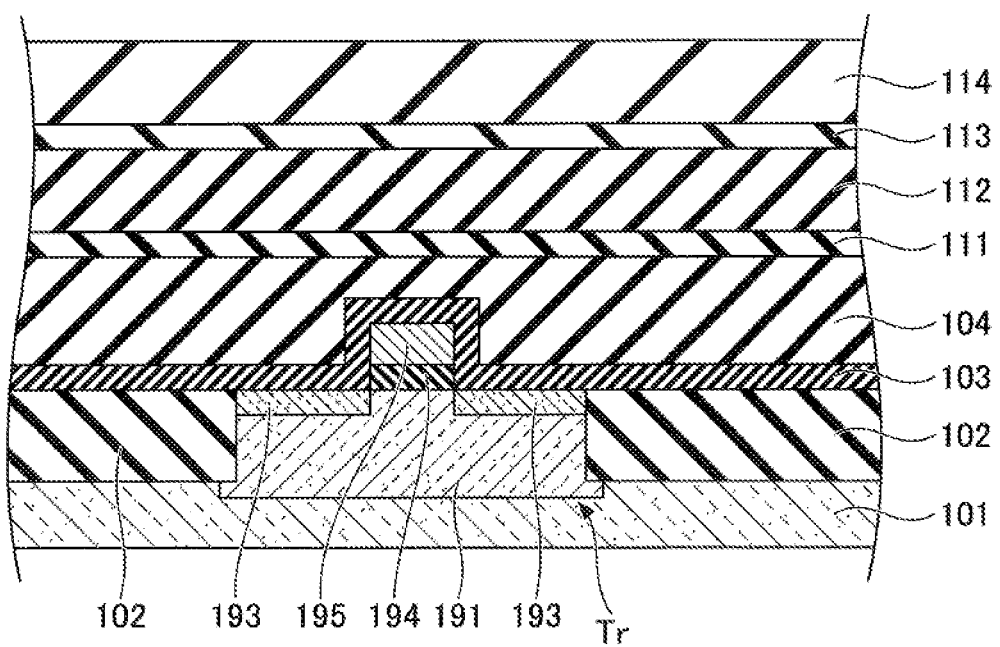
FIG. 2B is a cross-sectional view (part 2) illustrating a method for fabricating a semiconductor device according to the first embodiment.

Subsequently, as illustrated in FIG. 2B, a first insulating film 111, a second insulating film 112, a third insulating film 113, and a fourth insulating film 114 are sequentially formed in this order with respect to the insulating film 104. The third conductor 106 may be formed after the formation of the insulating film 103 and the insulating film 104. The first conductor 116 may be formed after the formation of the first insulating film 111 and the second insulating film 112. The second conductor 118 may be formed after the formation of the third insulating film 113 and the fourth insulating film 114.

Figure 2C:
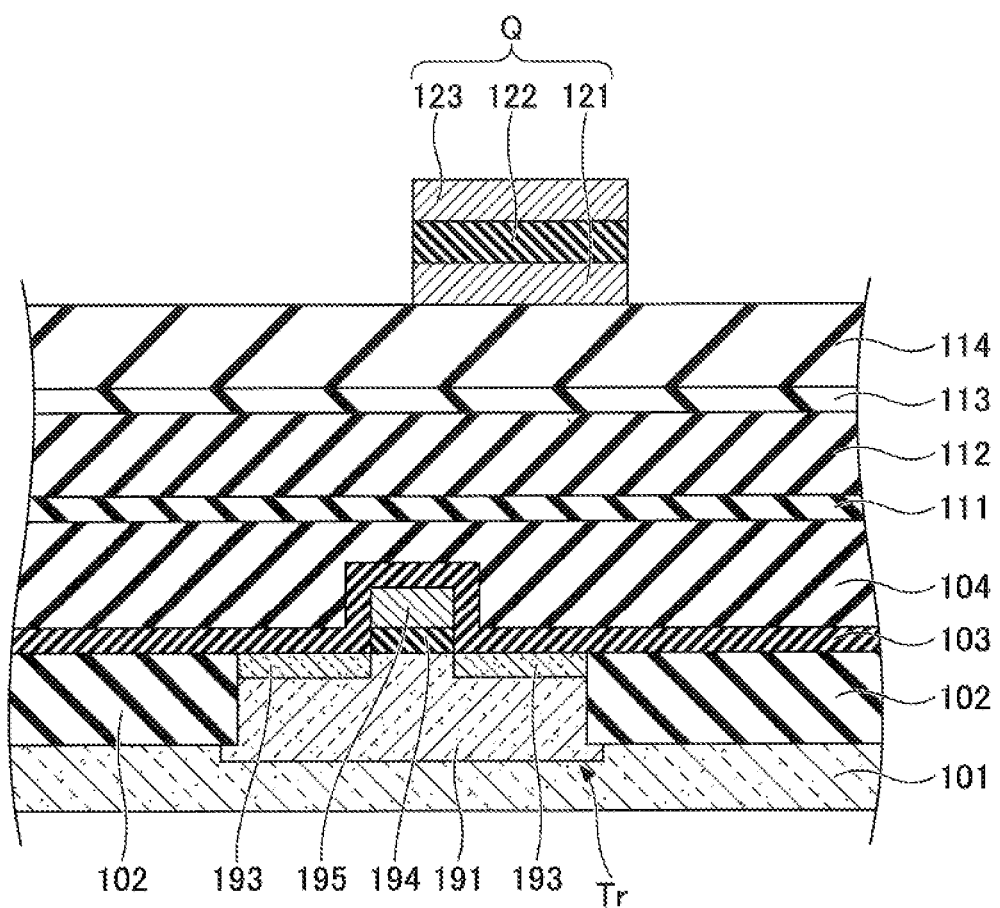
FIG. 2C is a cross-sectional view (part 3) illustrating the method for fabricating a semiconductor device according to the first embodiment.

Subsequently, as illustrated in FIG. 2C, a ferroelectric capacitor Q having the lower electrode 121, the ferroelectric film 122, and the upper electrode 123 is formed on the fourth insulating film 114.

Figure 2D:
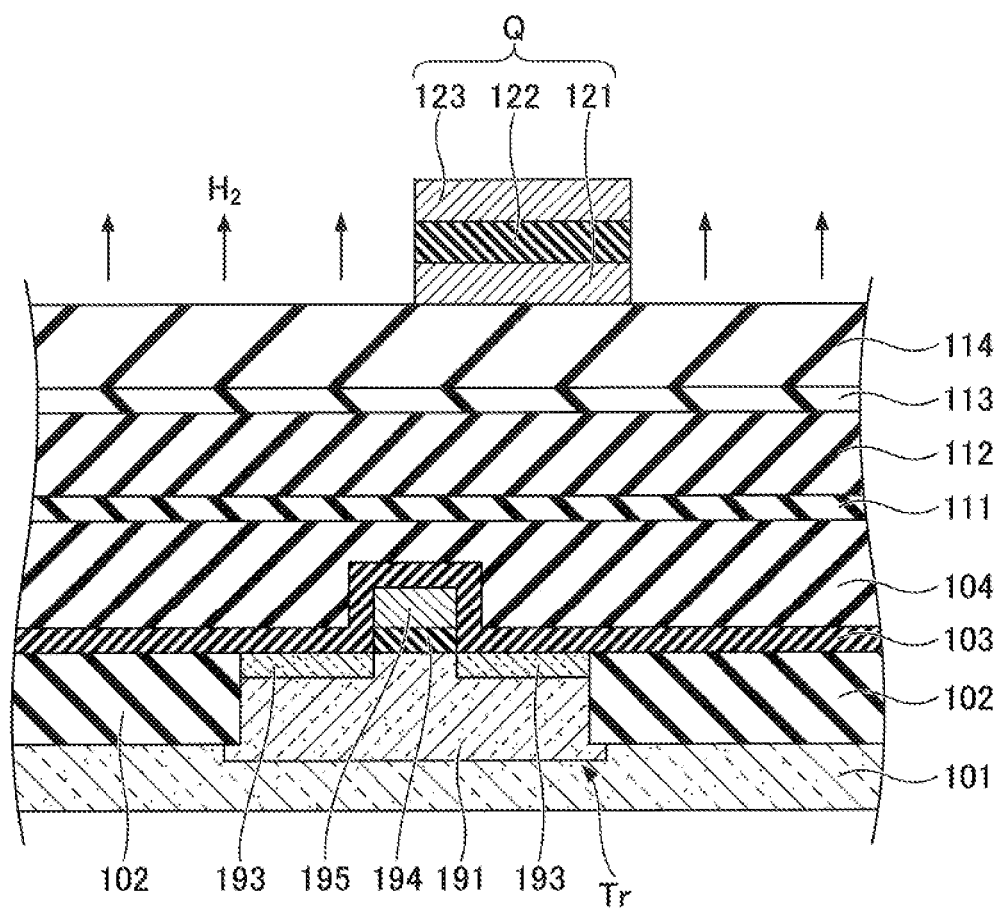
FIG. 2D is a cross-sectional view (part 4) illustrating the method for fabricating a semiconductor device according to the first embodiment.

Annealing is performed thereafter. In this annealing, moisture contained in the second insulating film 112 and moisture contained in the fourth insulating film 114 are decomposed into hydrogen and oxygen. Since among the first insulating film 111, the second insulating film 112, the third insulating film 113, and the fourth insulating film 114, the first insulating film 111 has the lowest hydrogen permeability, hydrogen generated in the second insulating film 112 and hydrogen generated in the fourth insulating film 114 are released upward above the fourth insulating film 114. That is, as illustrated in FIG. 2D, hydrogen contained in the second insulating film 112 and the fourth insulating film 114 is desorbed. This annealing may also serve as recovery annealing for the ferroelectric capacitor Q. The oxygen permeability of the first insulating film 111 and of the third insulating film 113 is lower than the oxygen permeability of the second insulating film 112 and of the fourth insulating film 114. Thus, even when annealing is performed under an atmosphere containing oxygen, the first conductor 116, the second conductor 118, and the third conductor 106 will hardly be oxidized.

Figure 2E:
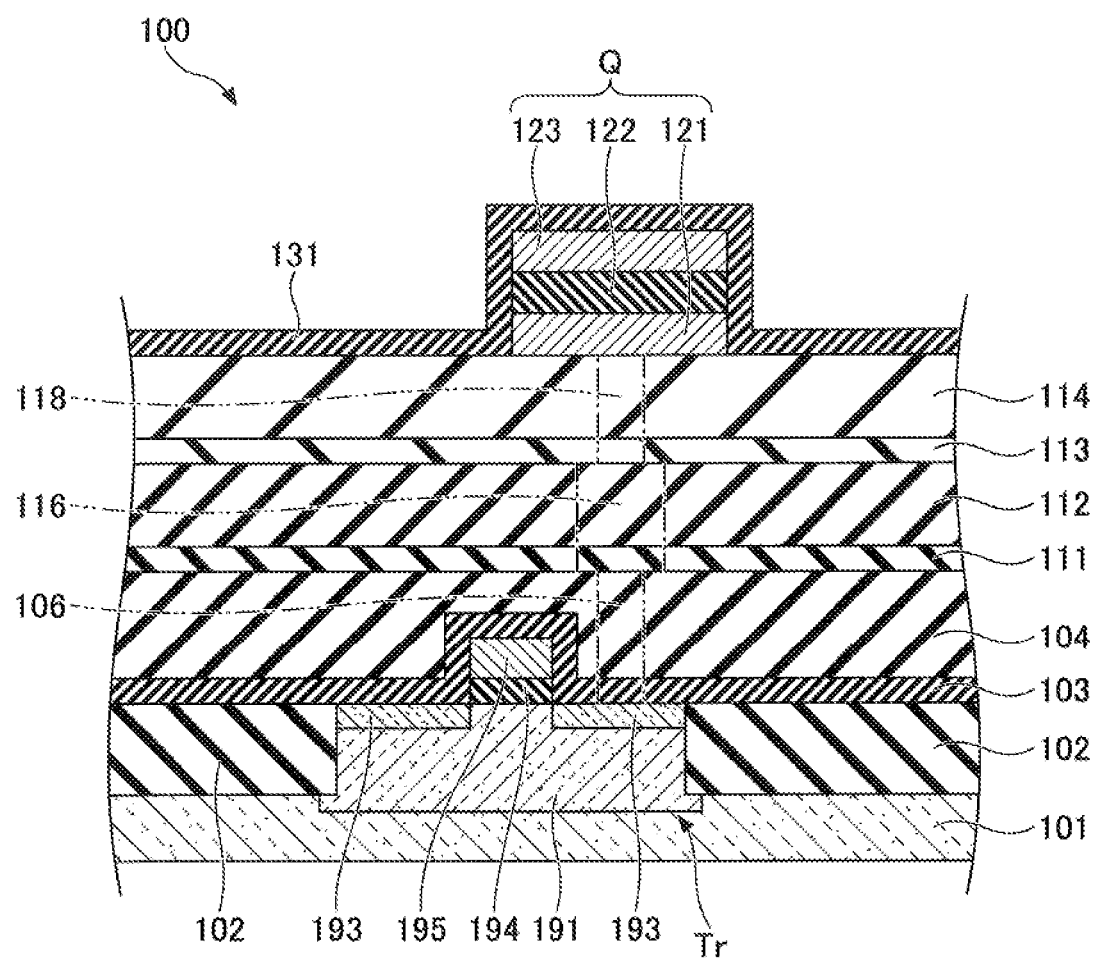
FIG. 2E is a cross-sectional view (part 5) illustrating the method for fabricating a semiconductor device according to the first embodiment.

Subsequently, as illustrated in FIG. 2E, a fifth insulating film 131 is formed on the fourth insulating film 114 so as to cover an upper surface and side surfaces of the ferroelectric capacitor Q.

Thereafter, upper layer wirings and the like are formed to complete the semiconductor device 100.

In the semiconductor device 100, among the first insulating film 111, the second insulating film 112, the third insulating film 113, and the fourth insulating film 114, the first insulating film 111 has the lowest hydrogen permeability, as described above, and hydrogen generated in the second insulating film 112 and hydrogen generated in the fourth insulating film 114 are thus released upward above the fourth insulating film 114. Hence, even upon exposure to a temperature at which water is decomposed during the formation of the upper layer wirings and the like after the formation of the fifth insulating film 131, deterioration of the ferroelectric capacitor Q due to moisture contained in the second insulating film 112 and the fourth insulating film 114 does not readily occur. In addition, deterioration of the ferroelectric capacitor Q due to long-term use does not readily occur. According to the first embodiment, deterioration of the ferroelectric capacitor due to hydrogen may further be reduced.

Second Embodiment

Figure 3:
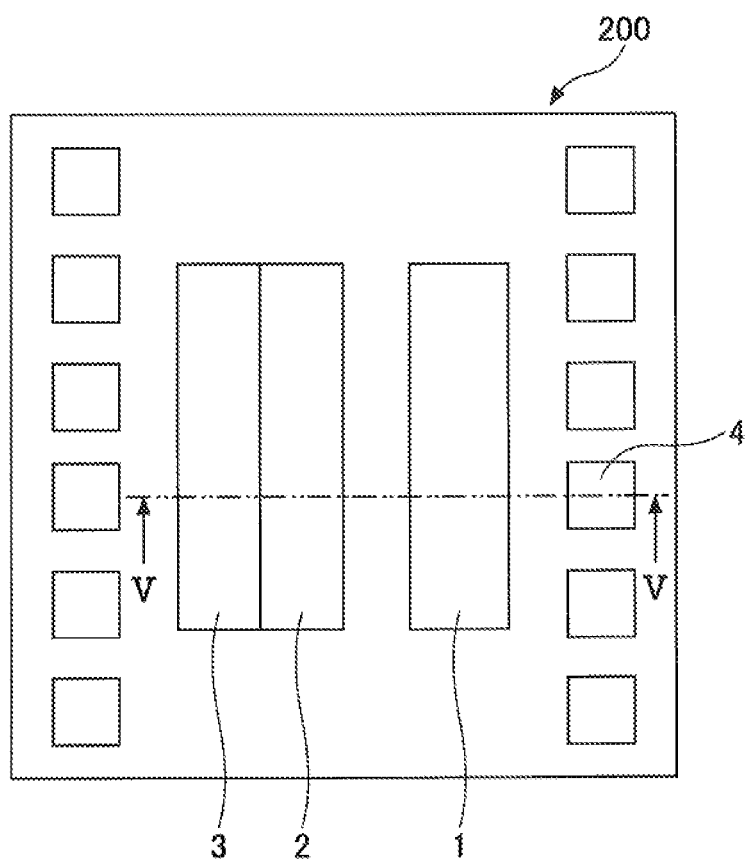
FIG. 3 is a view illustrating an outlined layout of a semiconductor device according to a second embodiment.
Figure 4:
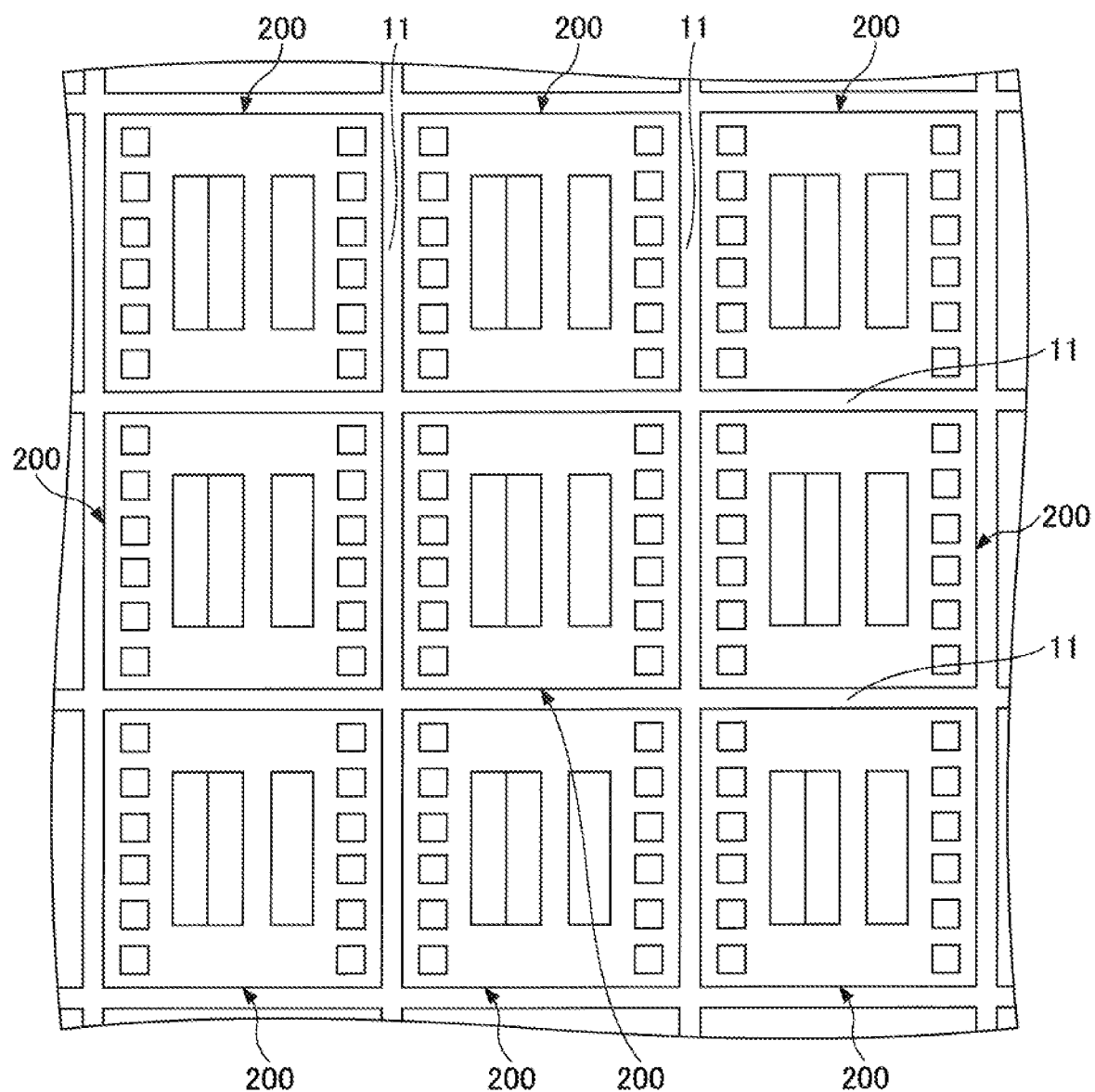
FIG. 4 is a view illustrating semiconductor device according to the second embodiment before being diced.
Figure 5:
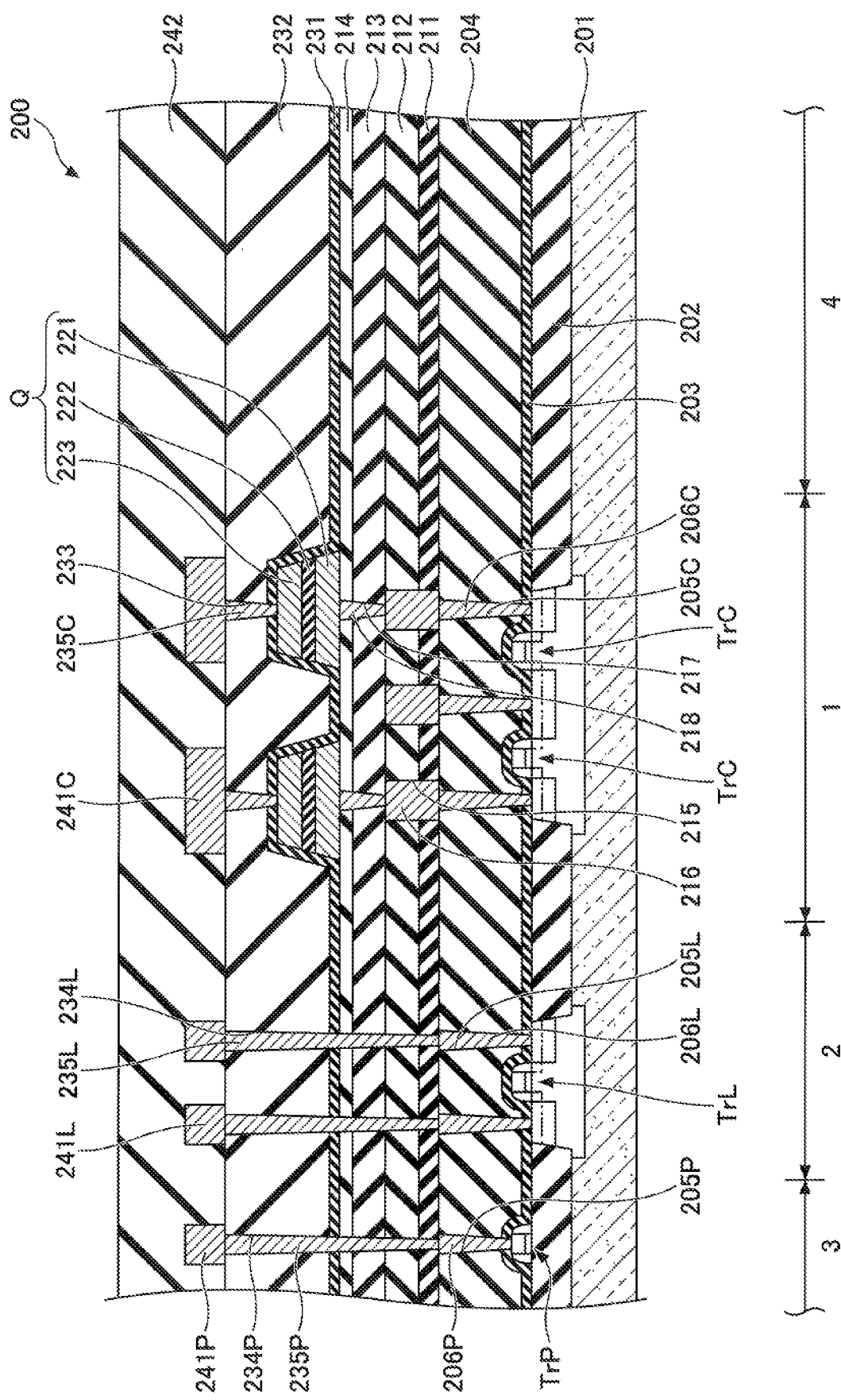
FIG. 5 is a cross-sectional view illustrating a semiconductor device according to the second embodiment.

The following describes a semiconductor device according to a second embodiment. The semiconductor device according to the second embodiment relates to an example of a ferroelectric memory. FIG. 3 is a view illustrating an outlined layout of a semiconductor device according to the second embodiment. FIG. 4 is a view illustrating the semiconductor device according to the second embodiment before being diced. FIG. 5 is a cross-sectional view illustrating a semiconductor device according to the second embodiment. FIG. 5 corresponds to a cross-sectional view taken along a line V-V in FIG. 3.

As illustrated in FIG. 3, the semiconductor device 200 according to the second embodiment includes a memory cell portion 1, a logic circuit portion 2, a peripheral circuit portion 3, and a pad portion 4. The pad portions 4 are disposed in the vicinity of an outer periphery of the semiconductor device 200, and the memory cell portion 1, the logic circuit portion 2, and the peripheral circuit portion 3 are disposed inward with respect to the pad portions 4.

For fabricating a semiconductor device 200, multiple semiconductor devices 200 are formed in parallel on one wafer, and semiconductor devices 200 are diced along dicing lines 11 by dicing processing as illustrated in FIG. 4. Details of the fabrication method of the semiconductor device 200 will be described later.

As illustrated in FIG. 5, in the semiconductor device 200, an element isolation insulating film 202 that defines an element region is formed on a surface of a substrate 201. Transistors TrC are formed in an element region within the memory cell portion 1, a transistor TrL is formed in an element region within the logic circuit portion 2, and a transistor TrP is formed in an element region within the peripheral circuit portion 3.

Figure 6:
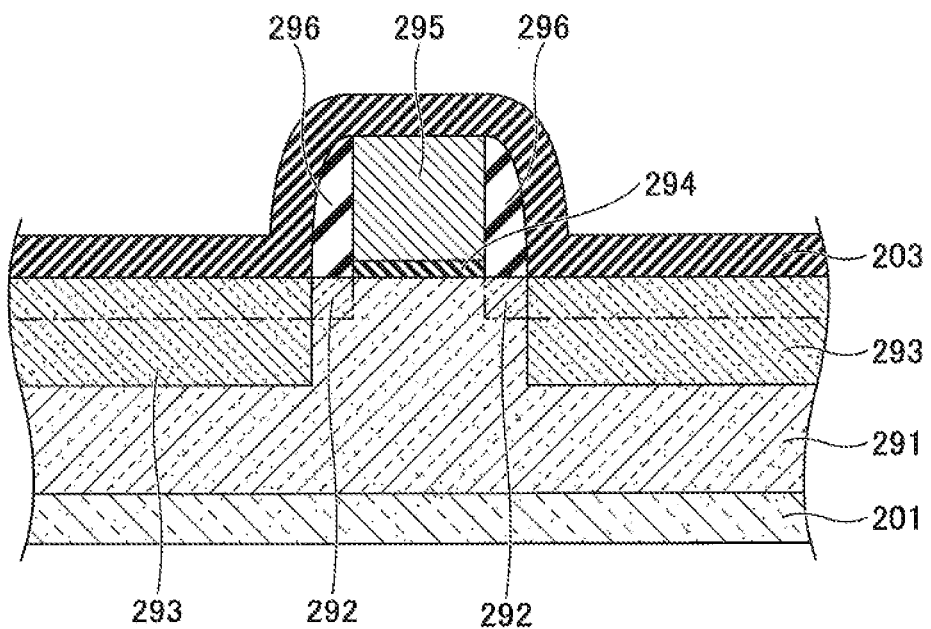
FIG. 6 is a cross-sectional view illustrating a transistor in a memory cell portion.

In the following, a transistor TrC will be described. FIG. 6 is a cross-sectional view illustrating a transistor inside the memory cell portions.

As illustrated in FIG. 6, the transistor TrC includes a P type well 291, an N-type low concentration impurity diffusion layer 292, an N-type high concentration impurity diffusion layer 293, a gate insulating film 294, a gate electrode 295, and a side wall insulating film 296. For example, boron (B) is contained as a P-type impurity in the well 291, phosphorus (P) is contained as an N-type impurity in the N-type low concentration impurity diffusion layer 292, and arsenic (As) is contained as an N-type impurity in the N-type high concentration impurity diffusion layer 293. For example, a gate length of the transistor TrC is 110 nm to 180 nm. The gate insulating film 294 is a silicon oxide film with a thickness of 6 nm to 7 nm. The gate electrode 295 is an amorphous silicon film with a thickness of 40 nm to 60 nm. The side wall insulating film 296 is a silicon oxide film with a thickness of 35 nm to 55 nm. A silicide film having a thickness of 120 nm to 180 nm such as a tungsten silicide (WSi) film may be formed on a surface of the gate electrode 295 and on a surface of the high concentration impurity diffusion layer 293.

As with the transistor TrC, the transistors TrL and TrP also include a well, an impurity diffusion layer, a gate insulating film, a gate electrode, and a sidewall insulating film. In FIG. 5 and the like, the gate electrode and the like of the transistor TrP are disposed on the element isolation insulating film 202, which indicates that the gate electrode and the like of the transistor TrP include portions to extend to the element isolation insulating film 202. As with the transistor TrP, the gate electrode of the transistor TrL and the like also include portions to extend to the element isolation insulating film 202.

An insulating film 203 that covers the transistor TrC, the transistor TrL, and the transistor TrP is formed above the substrate 201, and an interlayer insulating film 204 is formed on the insulating film 203. The insulating film 203 is, for example, a silicon oxynitride film (SiON film), and the interlayer insulating film 204 is a non-doped silicate glass (NSG) film having a flat surface.

An oxidation preventing film 211 is formed on the interlayer insulating film 204, and an interlayer insulating film 212 is formed on the oxidation preventing film 211. An oxidation preventing film 213 is formed on the interlayer insulating film 212, and an interlayer insulating film 214 is formed on the oxidation preventing film 213. For example, the oxidation preventing film 211 and the oxidation preventing film 213 are a silicon nitride (SiN) film, and the interlayer insulating film 212 and the interlayer insulating film 214 are a silicon oxide film. The nitrogen content of the oxidation preventing film 213 is lower than the nitrogen content of the oxidation preventing film 211, and a hydrogen permeability of the oxidation preventing film 213 is higher than a hydrogen permeability of the oxidation preventing film 211. For example, in an analysis by X-ray photoelectron spectroscopy, the oxidation preventing film 211 does not indicate an Si—O bond peak; however, the oxidation preventing film 213 indicates a Si—O bond peak. That is, the oxidation preventing film 213 exhibits a Si—O bond peak greater than that of the oxidation preventing film 211. A hydrogen permeability and an oxygen permeability of the interlayer insulating film 212 and of the interlayer insulating film 214 are higher than the hydrogen permeability and an oxygen permeability of the oxidation preventing film 211 and of the oxidation preventing film 213. For example, the nitrogen content of the oxidation preventing film 213 is 40.0 atom % or more and less than 45.0 atom %, and the ratio of the N content to the Si content in the oxidation preventing film 213 is 0.70 or more and less than 1.00. However, the nitrogen content of the oxidation preventing film 211 is 45.0 atomic % or more and 50.0 atomic % or less, and the ratio of the N content to the Si content in the oxidation preventing film 211 is 1.00 or more and 1.30 or less. Thus, the degree of nitridation in the oxidation preventing film 213 is lower than the degree of nitridation in the oxidation preventing film 211. The oxidation preventing film 211 and the oxidation preventing film 213 are formed across the memory cell portion 1, the logic circuit portion 2, the peripheral circuit portion 3, and the pad portion 4, such that the oxidation preventing film 211 and the oxidation preventing film 213 are provided over the entire semiconductor device 200 in plan view.

In the memory cell portion 1, the ferroelectric capacitors Q having a lower electrode 221, a ferroelectric film 222, and an upper electrode 223 are formed on an interlayer insulating film 214. For example, the lower electrode 221 includes an iridium (Ir) film, the ferroelectric film 222 includes a lead zirconate titanate (PZT) film, and the upper electrode 223 includes an iridium oxide ($IrO_x$) film. A barrier film 231 is formed on the interlayer insulating film 214 so as to cover the upper surface and side surfaces of each ferroelectric capacitor Q. A hydrogen permeability of the barrier film 231, such as an aluminum oxide ($AlO_x$) film, is lower than a hydrogen permeability of the oxidation preventing film 213, and an oxygen permeability of the barrier film 231 is lower than an oxygen permeability of the interlayer insulating film 212 and of the interlayer insulating film 214. The barrier film 231 is formed across the memory cell portion 1, the logic circuit portion 2, the peripheral circuit portion 3, and the pad portion 4, such that the barrier film 231 is provided over the entire semiconductor device 200 in plan view. An interlayer insulating film 232 is formed on the barrier film 231. For example, the interlayer insulating film 232 is a silicon oxide film having a flat surface.

In the memory cell portion 1, opening portions (contact holes) 205C are each formed in the insulating film 203 and the interlayer insulating film 204, and a conductive plug 206C is formed in the opening portions 205C. The conductive plug 206C is electrically connected to a high-concentration impurity diffusion layer of the transistor TrC. Opening portions (wiring trenches) 215 are formed in the oxidation preventing film 211 and the interlayer insulating film 212, and a wiring 216 is formed in the opening portions 215. Opening portions (via holes) 217 are each formed in the oxidation preventing film 213 and the interlayer insulating film 214, and a conductive plug 218 is formed in the opening portions 217. Opening portions (via holes) 233 are each formed in the barrier film 231 and the interlayer insulating film 232, and a conductive plug 235C is formed in the opening portions 233. For example, the conductive plug 206C, the wiring 216, the conductive plug 218, and the conductive plug 235C include a tungsten (W) film. A part of the wiring 216 functions as a conductive base for electrically connecting the conductive plug 206C and the conductive plug 218 to each other.

In the logic circuit portion 2, an opening portion (contact hole) 205L is formed in the insulating film 203 and the interlayer insulating film 204, and a conductive plug 206L is formed in the opening portion 205L. The conductive plug 206L is electrically connected to the high-concentration impurity diffusion layer of the transistor TrL. Opening portions (via holes) 234L are each formed in the oxidation preventing film 211, the interlayer insulating film 212, the oxidation preventing film 213, the interlayer insulating film 214, the barrier film 231 and the interlayer insulating film 232, and a conductive plug 235L is formed in the opening portions 234L. For example, the conductive plug 206L and the conductive plug 235L include a tungsten (W) film.

In the peripheral circuit portion 3, an opening portion (contact hole) 205P is formed in the insulating film 203 and the interlayer insulating film 204, and a conductive plug 206P is formed in the opening portion 205P. The conductive plug 206P is electrically connected to a gate electrode of the transistor TrP. An opening portion (via hole) 234P is formed in the oxidation preventing film 211, the interlayer insulating film 212, the oxidation preventing film 213, the interlayer insulating film 214, the barrier film 231 and the interlayer insulating film 232, and the conductive plug 235P is formed in the opening portion 234P. For example, the conductive plug 206P and the conductive plug 235P include a tungsten (W) film.

A wiring 241C connected to the conductive plug 235C, a wiring 241L connected to the conductive plug 235L, and a wiring 241P connected to the conductive plug 235P are formed on the interlayer insulating film 232. A flat interlayer insulating film 242 covering the wiring 241C, the wiring 241L, and the wiring 241P is formed over the interlayer insulating film 232. In the pad portion 4, a pad is formed on an outermost surface.

Figure 7:
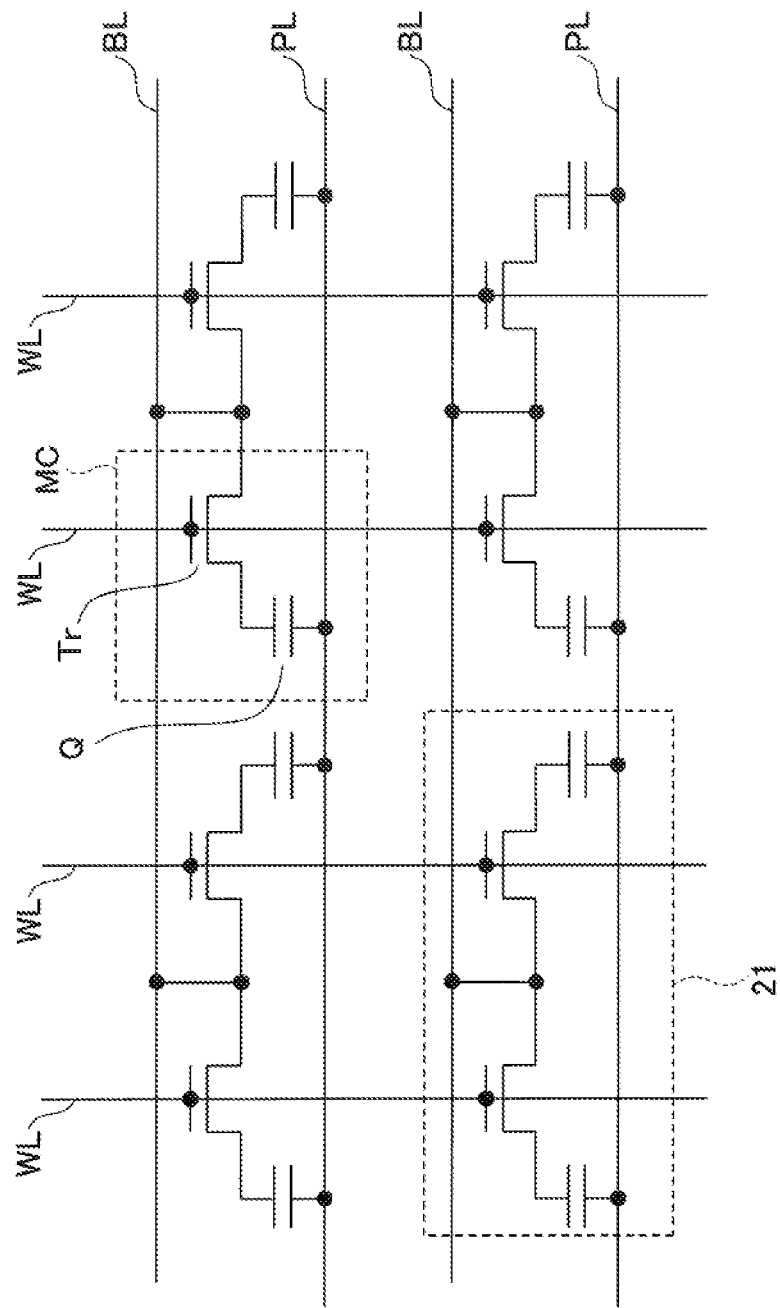
FIG. 7 is a view illustrating a circuit configuration of a memory cell portion.

The following describes a circuit configuration of the memory cell portion 1. FIG. 7 is a view illustrating a circuit configuration of a memory cell portion.

As illustrated in FIG. 7, the memory cell portion 1 includes a memory cell MC having one transistor TrC and one ferroelectric capacitor Q. The gate electrode 295 of the transistor TrC is included in a word line WL, the wiring 241C is included in a plate line PL, and the transistor TrC and the ferroelectric capacitor Q are electrically connected via the conductive plug 206C, the wiring 216, and the conductive plug 218. FIG. 5 illustrates a portion corresponding to a region 21 for two memory cells in FIG. 7, and the wirings 216 connected to the high concentration impurity diffusion layer 293 (see FIG. 6) shared by the two transistors TrC are included as a local interconnect in a bit line BL.

Next, a method for fabricating the semiconductor device 200 according to the second embodiment will be described. FIGS. 8A to 8E are cross-sectional views illustrating a fabrication method of the semiconductor device 200 according to the second embodiment in order of steps.

Figure 8A:
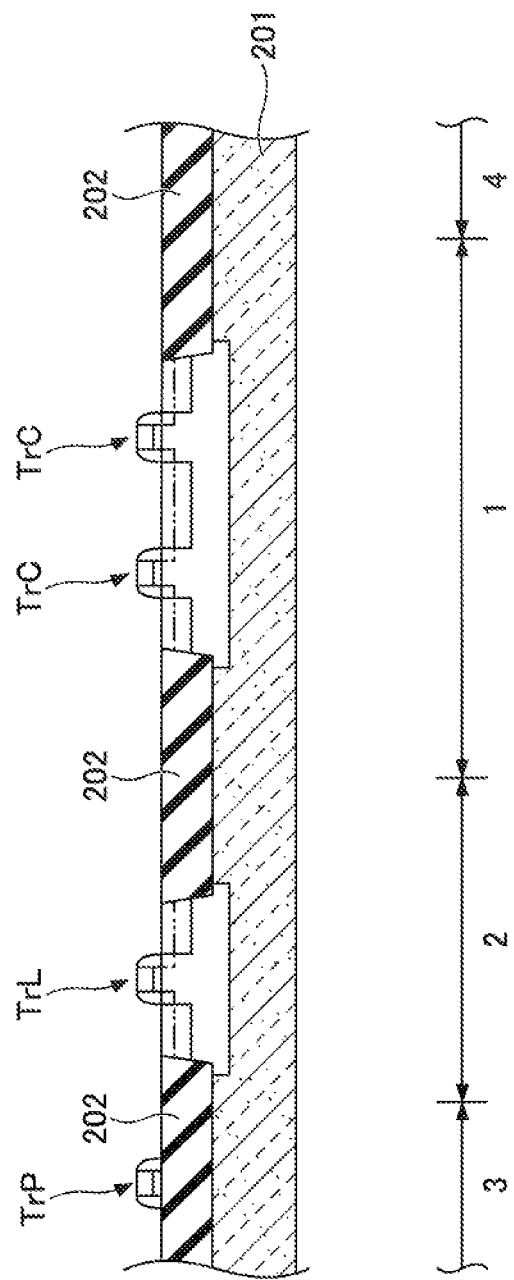
FIG. 8A is a cross-sectional view (part 1) illustrating a method for fabricating a semiconductor device according to the second embodiment.

First, as illustrated in FIG. 8A, an element isolation insulating film 202 for shallow trench isolation (STI) is formed on a surface of a substrate 201. Subsequently, transistors TrC are formed in an element region within the memory cell portion 1, a transistor TrL is formed in an element region within the logic circuit portion 2, and a transistor TrP is formed in an element region within the peripheral circuit portion 3. The formation of each transistor TrC may, for example, include: forming of a well 291 by boron (B) ion implantation; forming a gate insulating film 294 and a gate electrode 295; forming a low concentration impurity diffusion layer 292 by phosphorus (P) ion implantation using the gate electrode 295 as a mask; forming a sidewall insulating film 296; and forming a high-concentration impurity diffusion layer 293 by arsenic (As) ion implantation using the gate electrode 295 and the sidewall insulating film 296 as a mask. The formation of the transistors TrL and TrP may include forming of transistors having sizes and conductivity types according to integrated circuits.

Figure 8B:
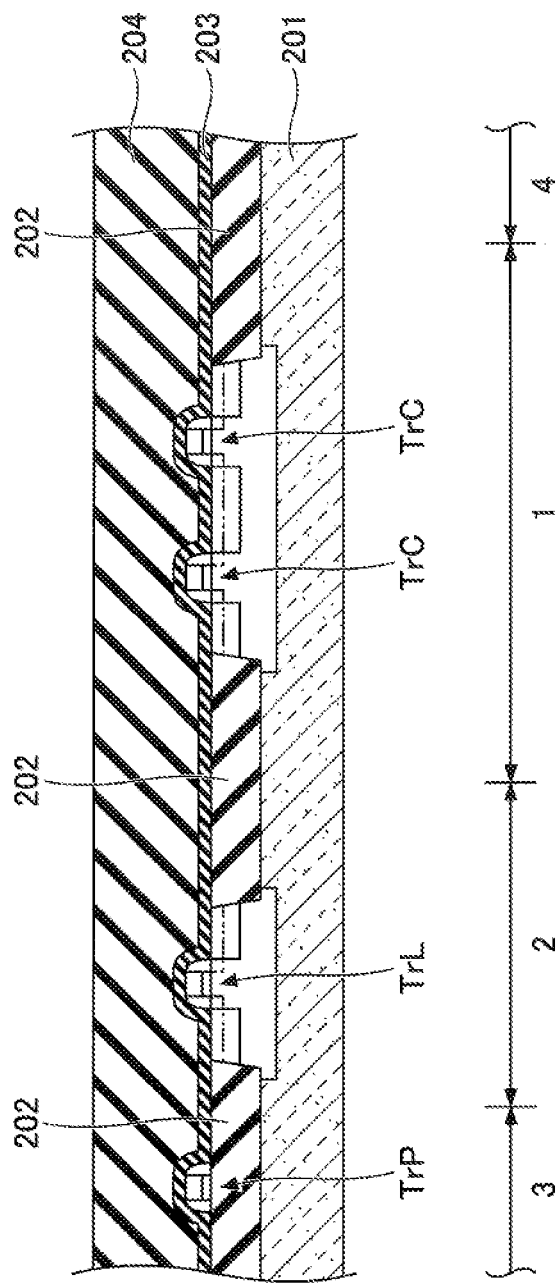
FIG. 8B is a cross-sectional view (part 2) illustrating the method for fabricating a semiconductor device according to the second embodiment.

After forming the transistors TrC, TrL and TrP, as illustrated in FIG. 8B, an insulating film 203 covering the transistors TrC, TrL and TrP is formed. As the insulating film 203, a silicon oxynitride film (SiON film) with a thickness of 160 nm to 240 nm that is formed by plasma chemical vapor deposition (CVD) method may be used, for example. Subsequently, an interlayer insulating film 204 is formed over the insulating film 203, and a surface of the interlayer insulating film 204 is planarized. As the interlayer insulating film 204, an NSG film with a thickness of 480 nm to 720 nm, which is formed using tetraethyl orthosilicate (TEOS) by a plasma CVD method, may be used, for example. The thickness of the interlayer insulating film 204 may be 1000 nm to 1200 nm. In planarization of the surface of the interlayer insulating film 204, the surface of the interlayer insulating film 204 is polished by 160 nm to 240 nm by a chemical mechanical polishing (CMP) method.

Figure 8C:
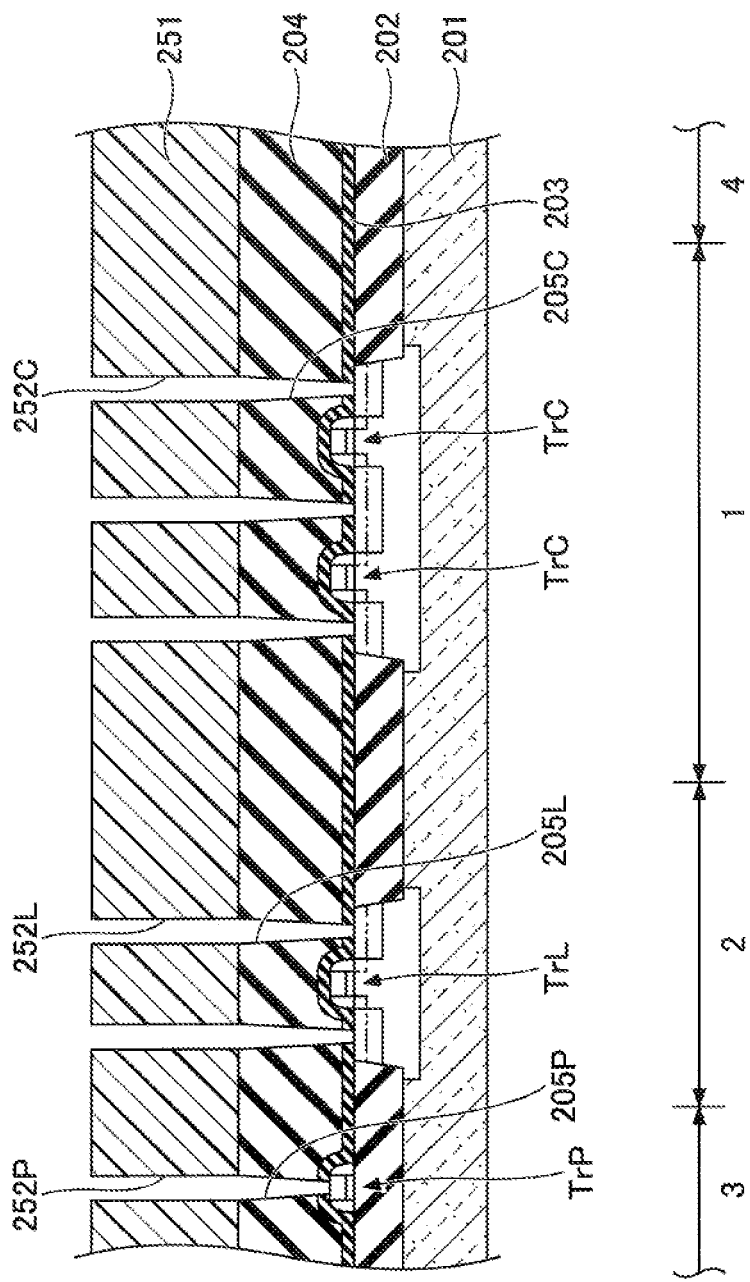
FIG. 8C is a cross-sectional view (part 3) illustrating the method for fabricating a semiconductor device according to the second embodiment.

Thereafter, as illustrated in FIG. 8C, a resist pattern 251 is formed on the interlayer insulating film 204. The resist pattern 251 includes opening portions 252C exposing planned contact hole formation regions in the memory cell portion 1, opening portions 252L exposing planned contact hole formation regions in the logic circuit portion 2, and an opening portion 252P exposing a planned contact hole formation region in the peripheral circuit portion 3. Subsequently, the interlayer insulating film 204 and the insulating film 203 are etched using the resist pattern 251 as a mask. As a result, opening portions (contact holes) 205C are formed in the memory cell portion 1, opening portions (contact holes) 205L are formed in the logic circuit portion 2, and an opening portion (contact hole) 205P is formed in the peripheral circuit portion 3.

Figure 8D:
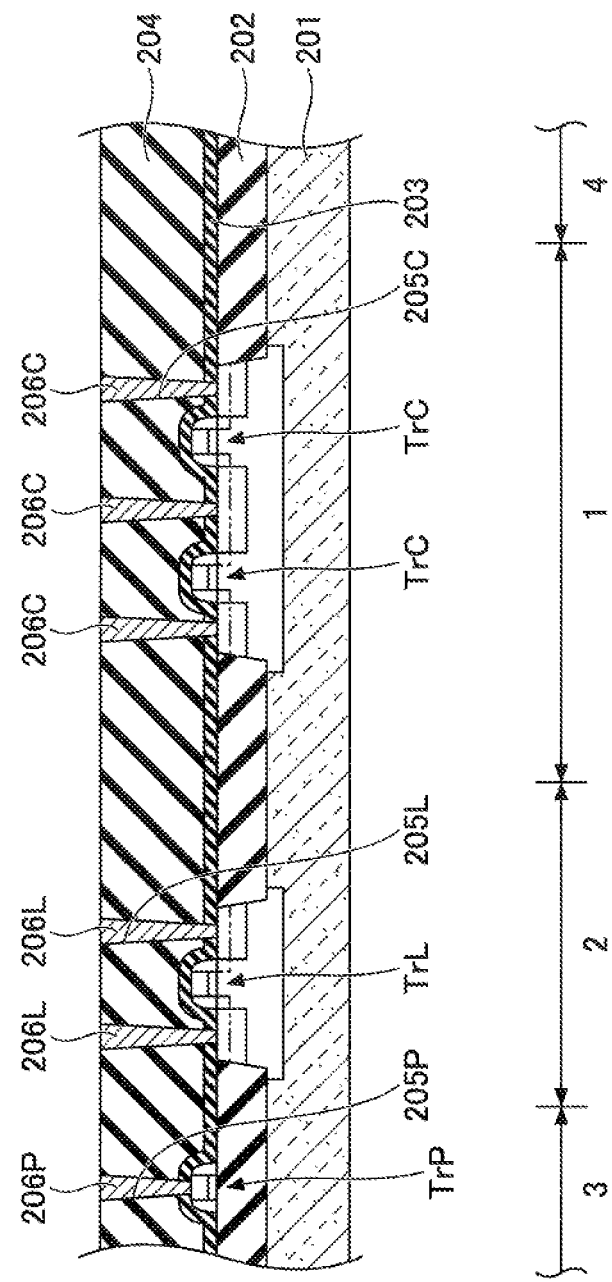
FIG. 8D is a cross-sectional view (part 4) illustrating the method for fabricating the semiconductor device according to the second embodiment.

Subsequently, as illustrated in FIG. 8D, the resist pattern 251 is removed, conductive plugs 206C are formed in the opening portions 205C, conductive plugs 206L are formed in the opening portions 205L, and a conductive plug 206P is formed in the opening portion 205P. The formation of the conductive plugs 206C, the conductive plugs 206L and the conductive plug 206P may, for example, include: forming a barrier metal film by a physical vapor deposition (PVD) method; forming a tungsten (W) film on the barrier metal film by a CVD method; and removing the barrier metal film and the W film on the interlayer insulating film 204. The formation of the barrier metal film may, for example, include: forming a titanium (Ti) film having a thickness of 16 nm to 24 nm; and forming a titanium nitride (TiN) film having a thickness of 40 nm to 60 nm on the titanium (Ti) film. The thickness of the W film is 400 nm to 600 nm. The barrier metal film and the W film on the interlayer insulating film 204 may be removed by a CMP method, for example.

Figure 8E:
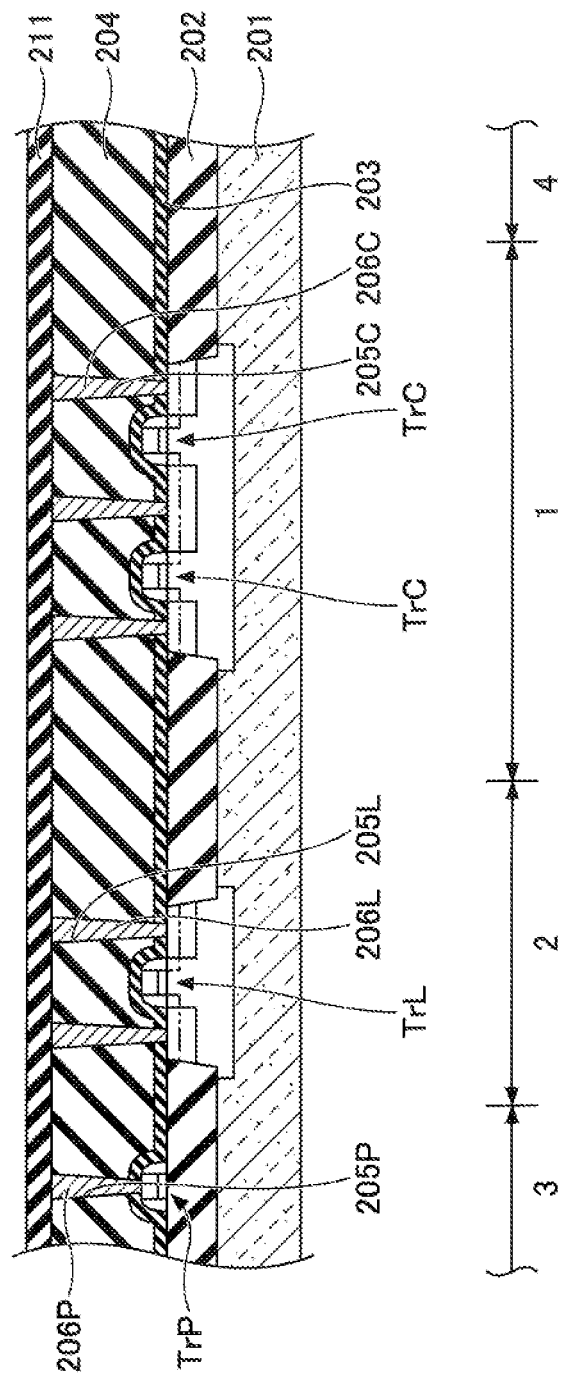
FIG. 8E is a cross-sectional view (part 5) illustrating the method for fabricating the semiconductor device according to the second embodiment.

Thereafter, as illustrated in FIG. 8E, an oxidation preventing film 211 is formed on the interlayer insulating film 204, the conductive plugs 206C, the conductive plugs 206L, and the conductive plug 206P. As the oxidation preventing film 211, a first silicon nitride (SiN) film having a thickness of 32 nm to 48 nm that is formed by a CVD method may be used, for example. In the formation of the first SiN film, for example, silane ($SiH_4$) is used as a raw material of Si; ammonia ($NH_3$) or dinitrogen monoxide ($N_2O$), or both of ammonia ($NH_3$) and dinitrogen monoxide ($N_2O$) are used as a raw material of N; and a first N/Si ratio of a supply amount of N atoms to a supply amount of Si atoms is 190 to 230.

Figure 8F:
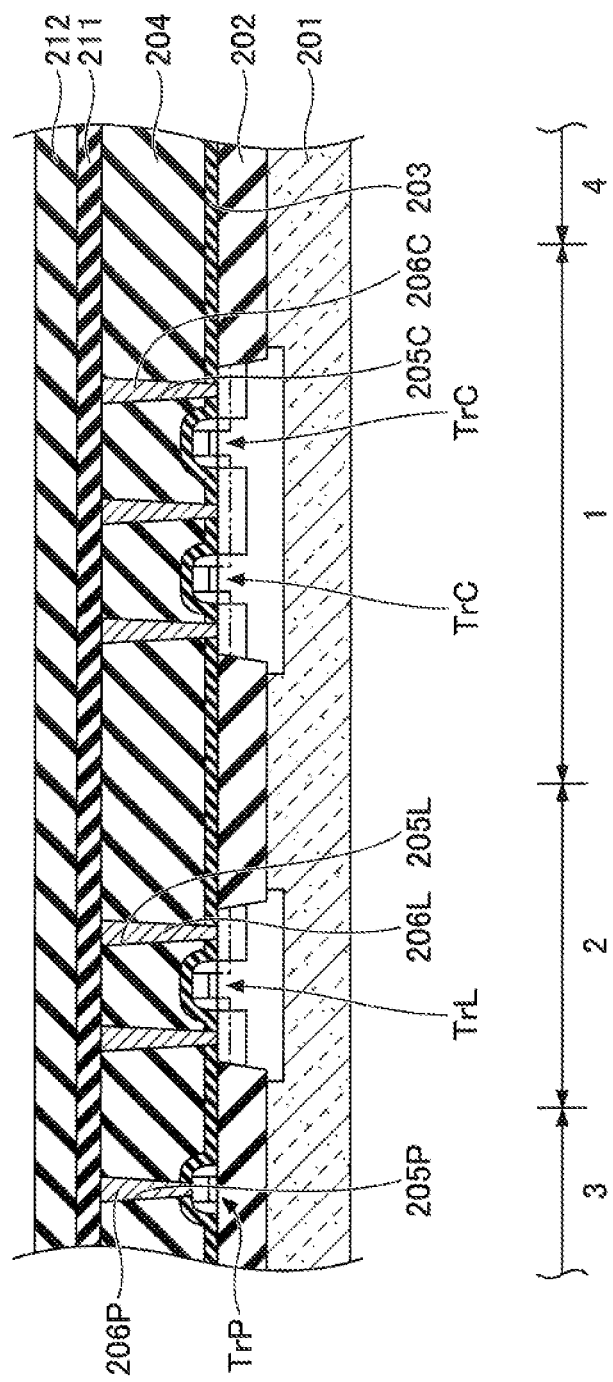
FIG. 8F is a cross-sectional view (part 6) illustrating the method for fabricating a semiconductor device according to the second embodiment.

Subsequently, as illustrated in FIG. 8F, an interlayer insulating film 212 is formed on the oxidation preventing film 211. As the interlayer insulating film 212, for example, a silicon oxide film having a thickness of 200 nm to 300 nm that is formed by plasma CVD method using tetraethoxysilane (TEOS) may be used.

Figure 8G:
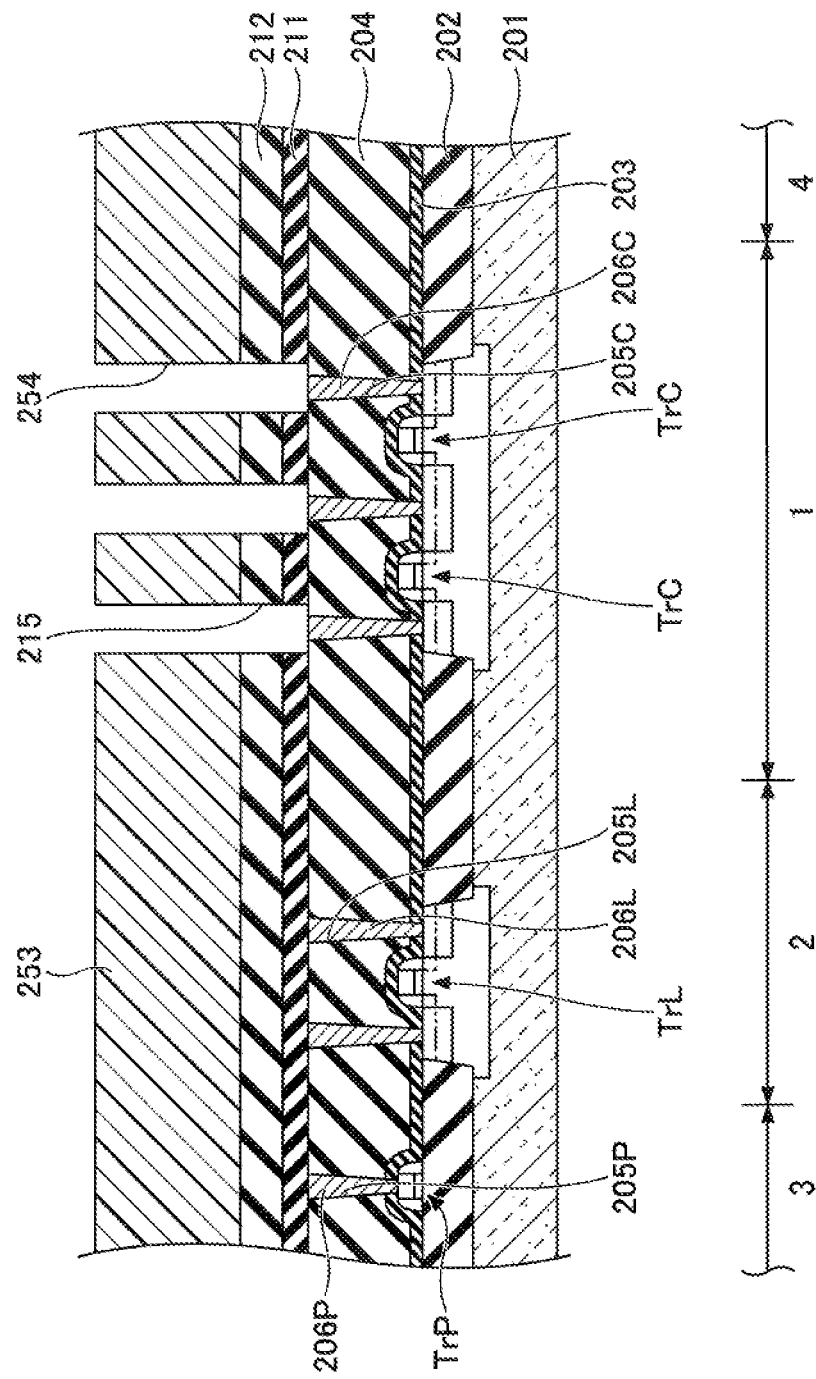
FIG. 8G is a cross-sectional view (part 7) illustrating the method for fabricating a semiconductor device according to the second embodiment.

Next, as illustrated in FIG. 8G, a resist pattern 253 is formed on the interlayer insulating film 212. The resist pattern 253 has opening portions 254 that expose planned wiring trench formation regions in the memory cell portion 1. Thereafter, the interlayer insulating film 212 and the oxidation preventing film 211 are etched using the resist pattern 253 as a mask. As a result, opening portions (wiring trenches) 215 are formed in the memory cell portion 1.

Figure 8H:
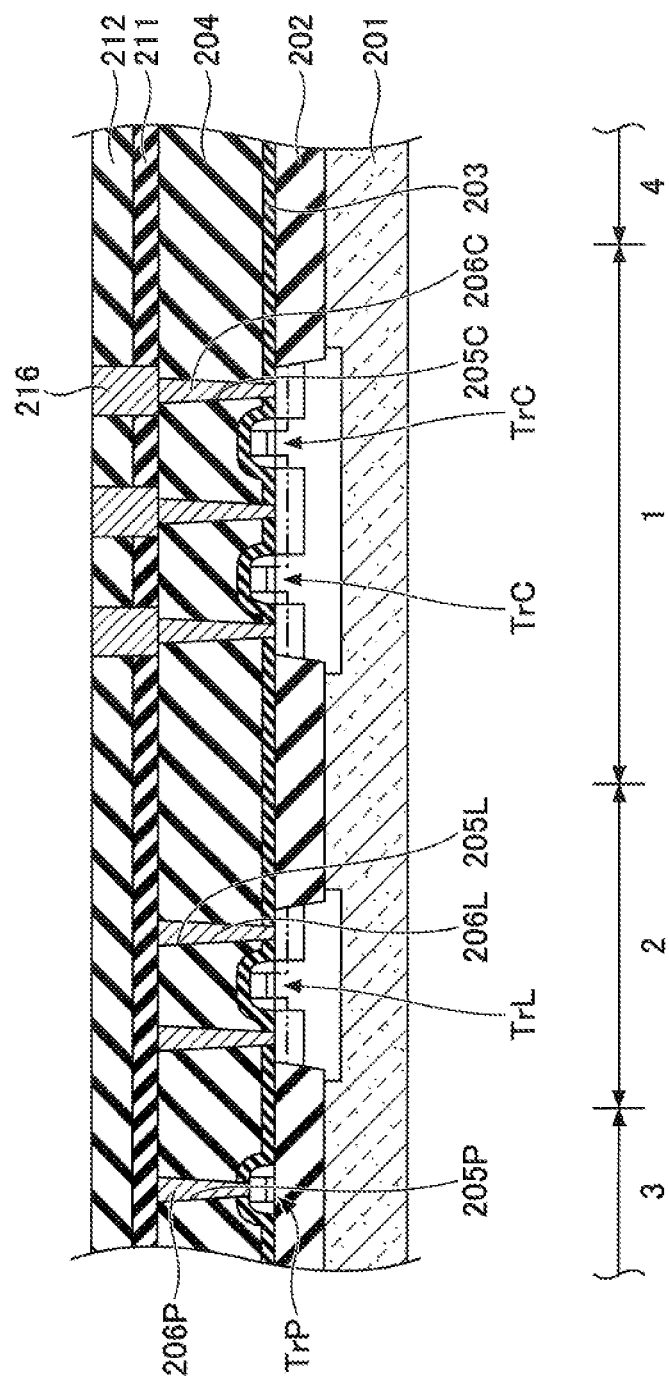
FIG. 8H is a cross-sectional view (part 8) illustrating the method for fabricating a semiconductor device according to the second embodiment.

Subsequently, as illustrated in FIG. 8H, the resist pattern 253 is removed, and the wirings 216 are formed in the opening portions 215. The formation of the wirings 216 may, for example, include forming a barrier metal film by a PVD method, forming a W film on the barrier metal film by a CVD method, and removing the barrier metal film and the W film on the interlayer insulating film 212. The formation of the barrier metal film may, for example, include forming a Ti film having a thickness of 8 nm to 12 nm, and forming a TiN film having a thickness of 16 nm to 24 nm on the Ti film. The thickness of the W film is 240 nm to 360 nm. The barrier metal film and the W film on the interlayer insulating film 212 may be removed by a CMP method, for example.

Figure 8I:
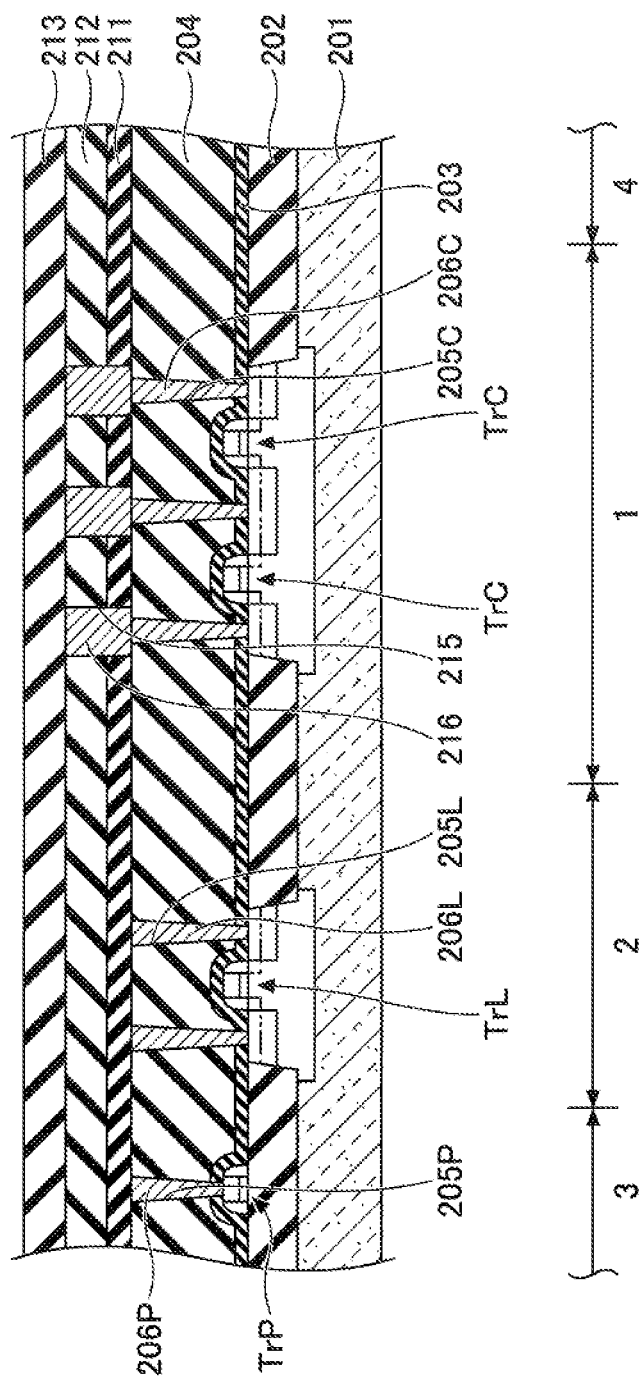
FIG. 8I is a cross-sectional view (part 9) illustrating the method for fabricating a semiconductor device according to the second embodiment.

Subsequently, as illustrated in FIG. 8I, an oxidation preventing film 213 is formed on the interlayer insulating film 212 and the wirings 216. As the oxidation preventing film 213, for example, a second silicon nitride (SiN) film having a thickness of 80 nm to 180 nm that is formed by a CVD method may be used, for example. In the formation of the first SiN film, for example, silane ($SiH_4$) is used as a raw material of Si; ammonia ($NH_3$) or dinitrogen monoxide ($N_2O$), or both of ammonia ($NH_3$) and dinitrogen monoxide ($N_2O$) are used as a raw material of N; and a second N/Si ratio of a supply amount of N atoms to a supply amount of Si atoms is made smaller than the first N/Si ratio. For example, the second N/Si ratio is 100 to 185.

Figure 8J:
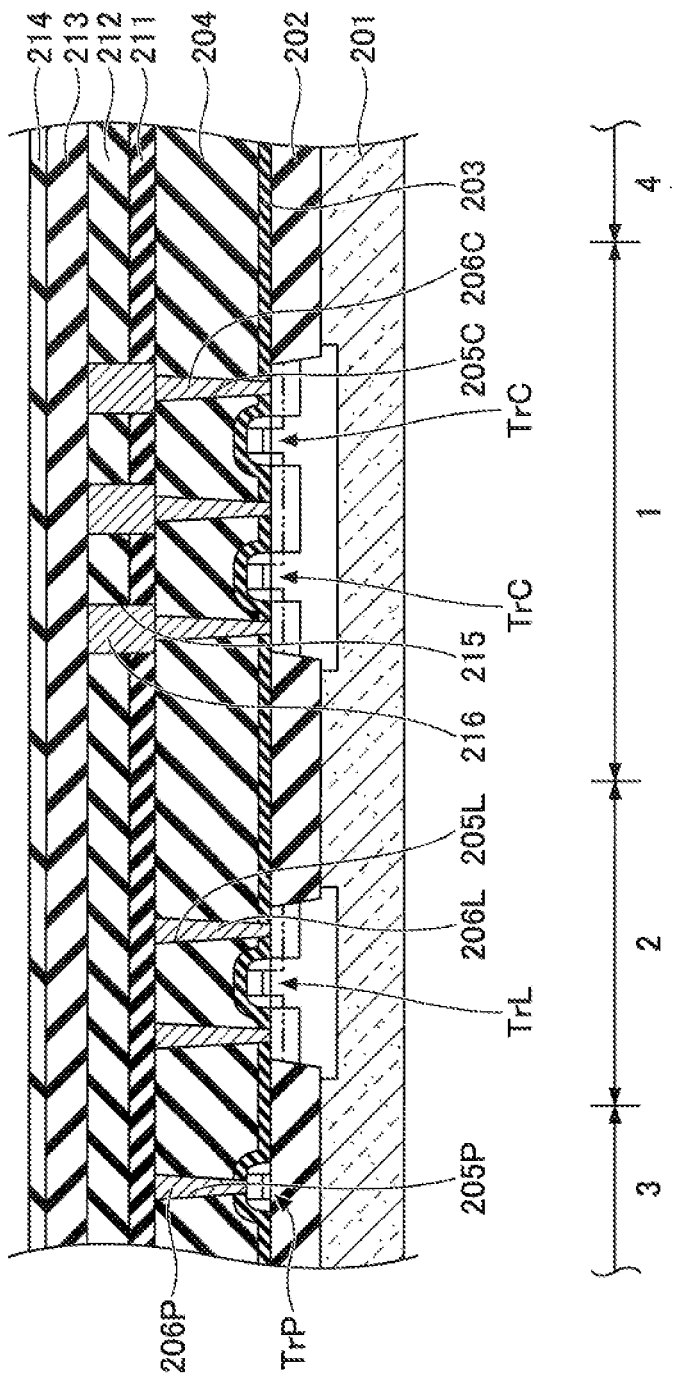
FIG. 8J is a cross-sectional view (part 10) illustrating the method for fabricating a semiconductor device according to the second embodiment.

Subsequently, as illustrated in FIG. 8J, an interlayer insulating film 214 is formed on the oxidation preventing film 213. As the interlayer insulating film 214, a silicon oxide film having a thickness of 180 nm to 280 nm that is formed by plasma CVD method using TEOS may be used, for example.

Figure 8K:
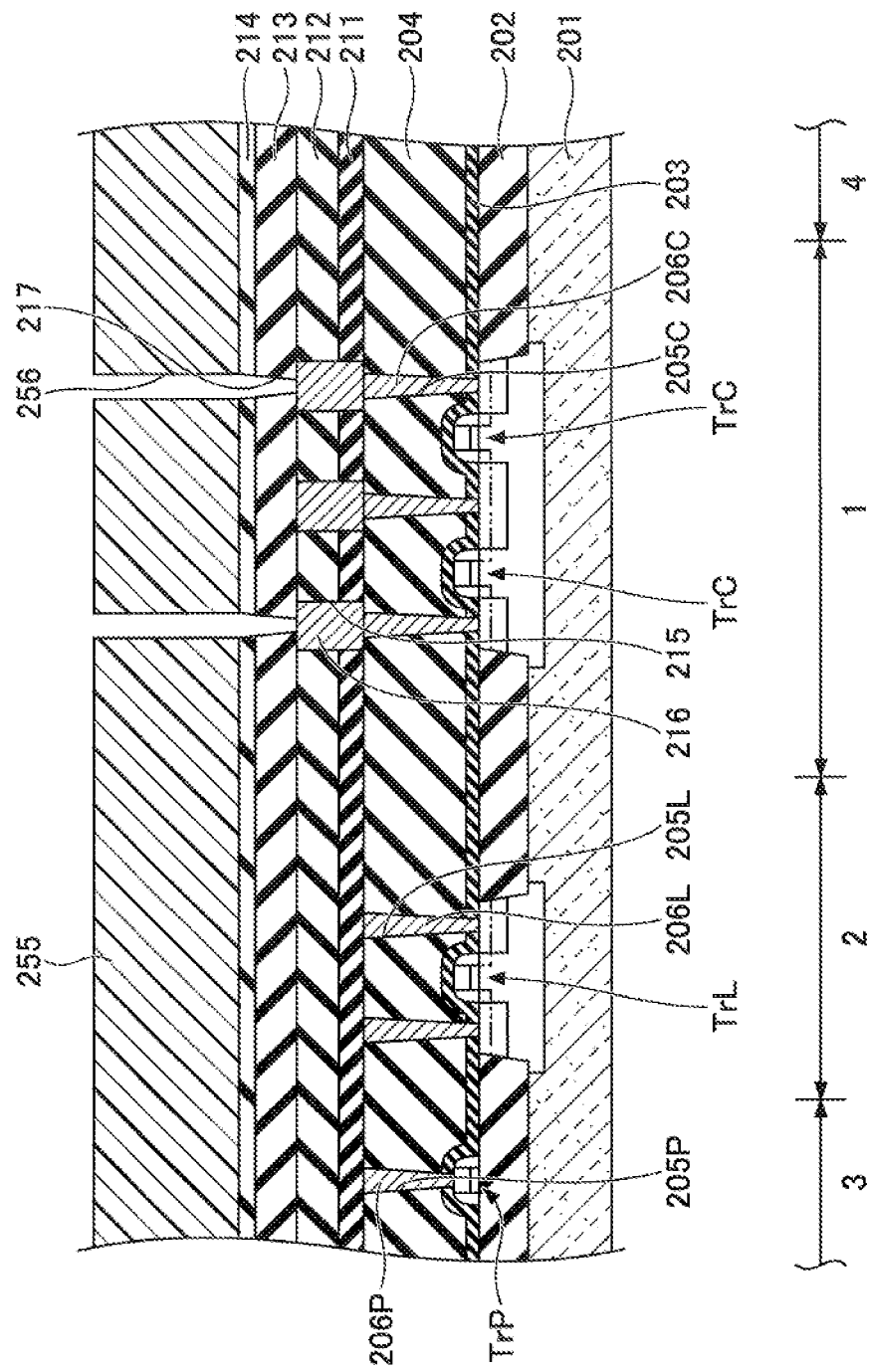
FIG. 8K is a cross-sectional view (part 11) illustrating the method for fabricating a semiconductor device according to the second embodiment.

Subsequently, as illustrated in FIG. 8K, a resist pattern 255 is formed on the interlayer insulating film 214. The resist pattern 255 has opening portions 256 that expose planned via hole formation regions in the memory cell portion 1. Subsequently, the interlayer insulating film 214 and the oxidation preventing film 213 are etched using the resist pattern 255 as a mask. As a result, opening portions (via holes) 217 are formed in the memory cell portion 1.

Figure 8L:
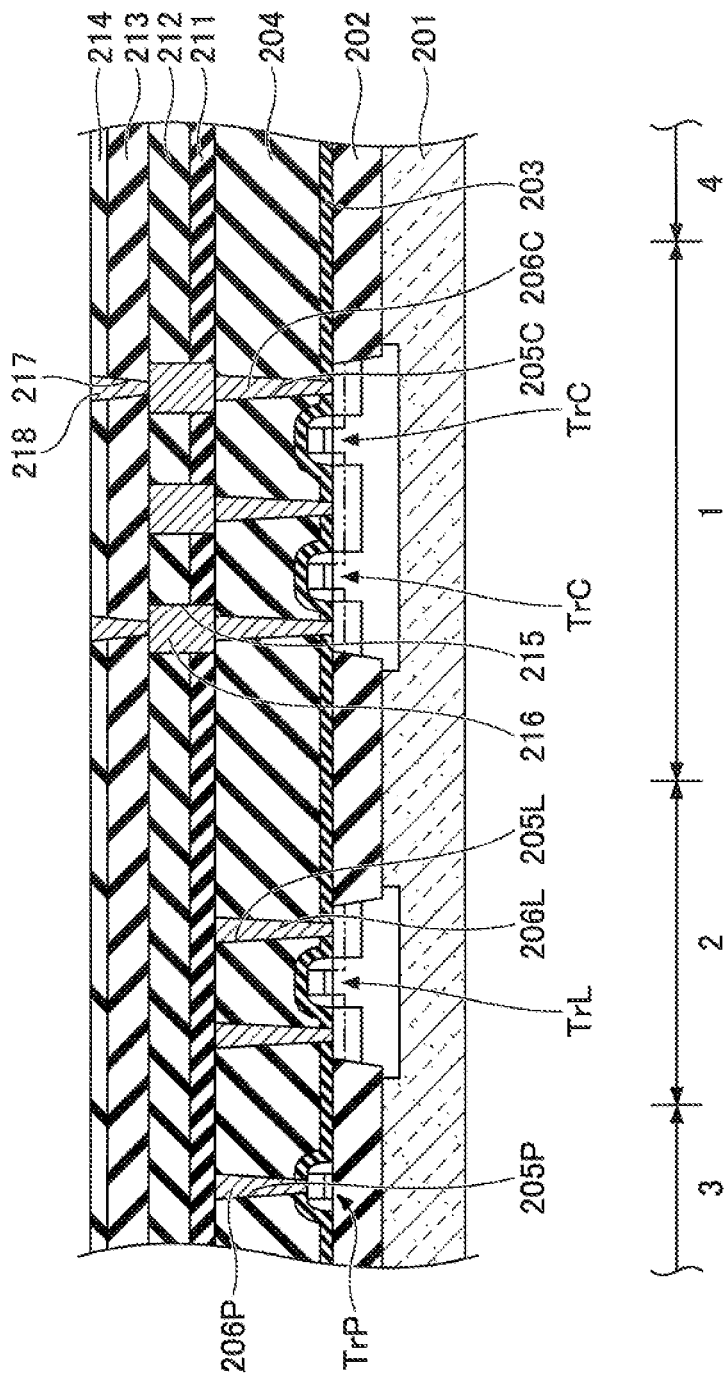
FIG. 8L is a cross-sectional view (part 12) illustrating the method for fabricating a semiconductor device according to the second embodiment.

Subsequently, as illustrated in FIG. 8L, the resist pattern 255 is removed, and conductive plugs 218 are formed in the opening portions 217. The formation of the conductive plugs 218 may, for example, include: forming a barrier metal film by a PVD method; forming a W film on the barrier metal film by a CVD method; and removing the barrier metal film and the W film on the interlayer insulating film 214. The formation of the barrier metal film may, for example, include forming a Ti film having a thickness of 8 nm to 12 nm, and forming a TiN film having a thickness of 16 nm to 24 nm on the Ti film. The thickness of the W film is 240 nm to 360 nm. The barrier metal film and the W film on the interlayer insulating film 214 may be removed by a CMP method, for example.

Figure 8M:
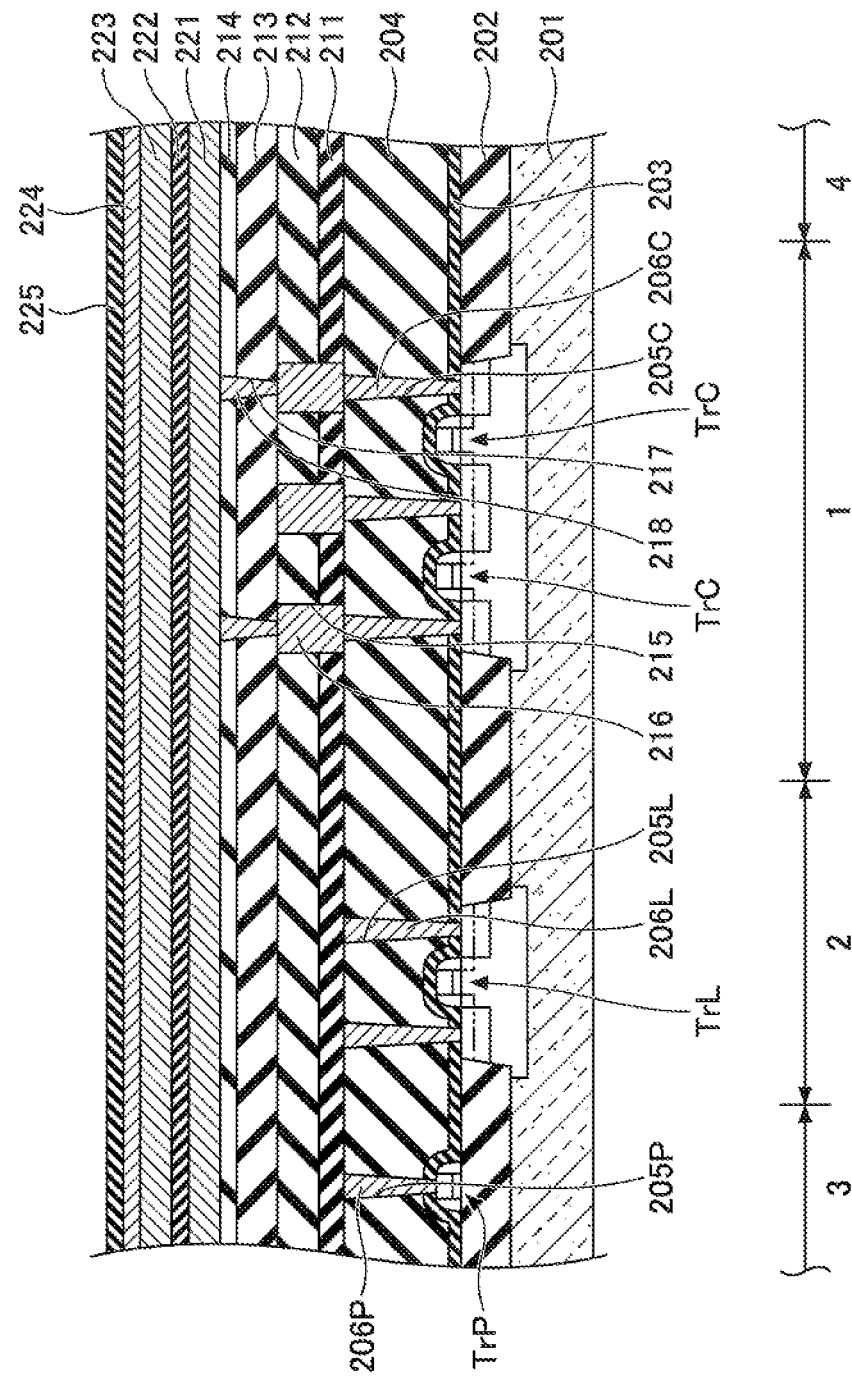
FIG. 8M is a cross-sectional view (part 13) illustrating the method for fabricating a semiconductor device according to the second embodiment.

Thereafter, as illustrated in FIG. 8M, a lower electrode 221, a ferroelectric film 222, an upper electrode 223, a hard mask 224, and an insulating film 225 are sequentially formed in this order with respect to the interlayer insulating film 214 and the conductive plugs 218. As the lower electrode 221, an iridium (Ir) film having a thickness of 40 nm to 60 nm that is formed by a PVD method may be used, for example. As the ferroelectric film 222, a PZT film having a thickness of 75 nm to 85 nm may be used, for example. As the upper electrode 223, an iridium oxide ($IrO_x$) film having a thickness of 160 nm to 240 nm that is formed by a PVD method may be used, for example. As the hard mask 224, a titanium aluminum nitride (TiAlN) film having a thickness of 160 nm to 240 nm that is formed by a PVD method may be used. As the insulating film 225, a silicon oxide film having a thickness of 160 nm to 240 nm that is formed by plasma CVD method using TEOS may be used, for example.

Crystallization annealing may be performed at a time between the formation of the ferroelectric film 222 and the formation of the upper electrode 223 to promote crystallization of the ferroelectric film 222.

Figure 8N:
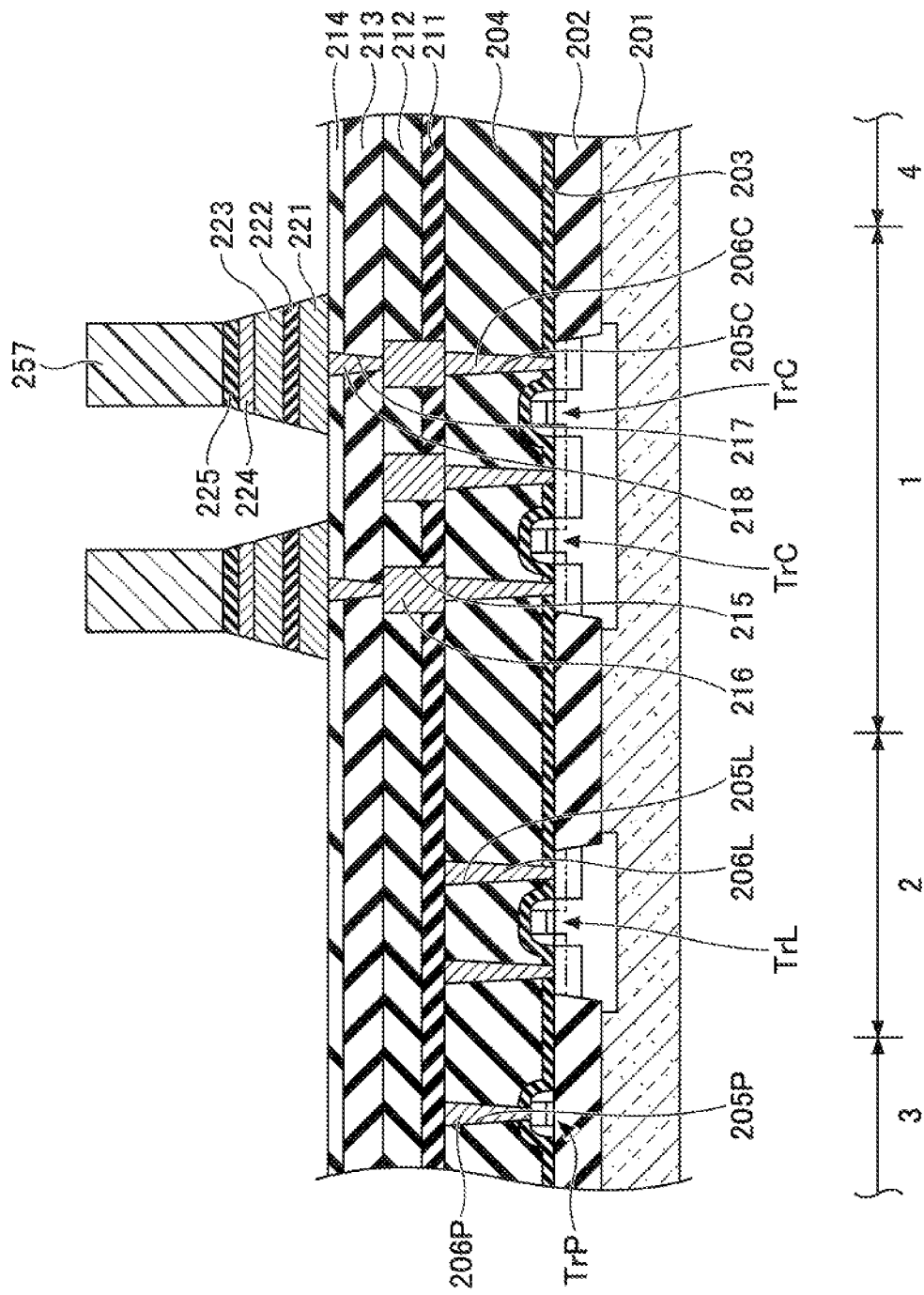
FIG. 8N is a cross-sectional view (part 14) illustrating the method for fabricating a semiconductor device according to the second embodiment.
Figure 80:
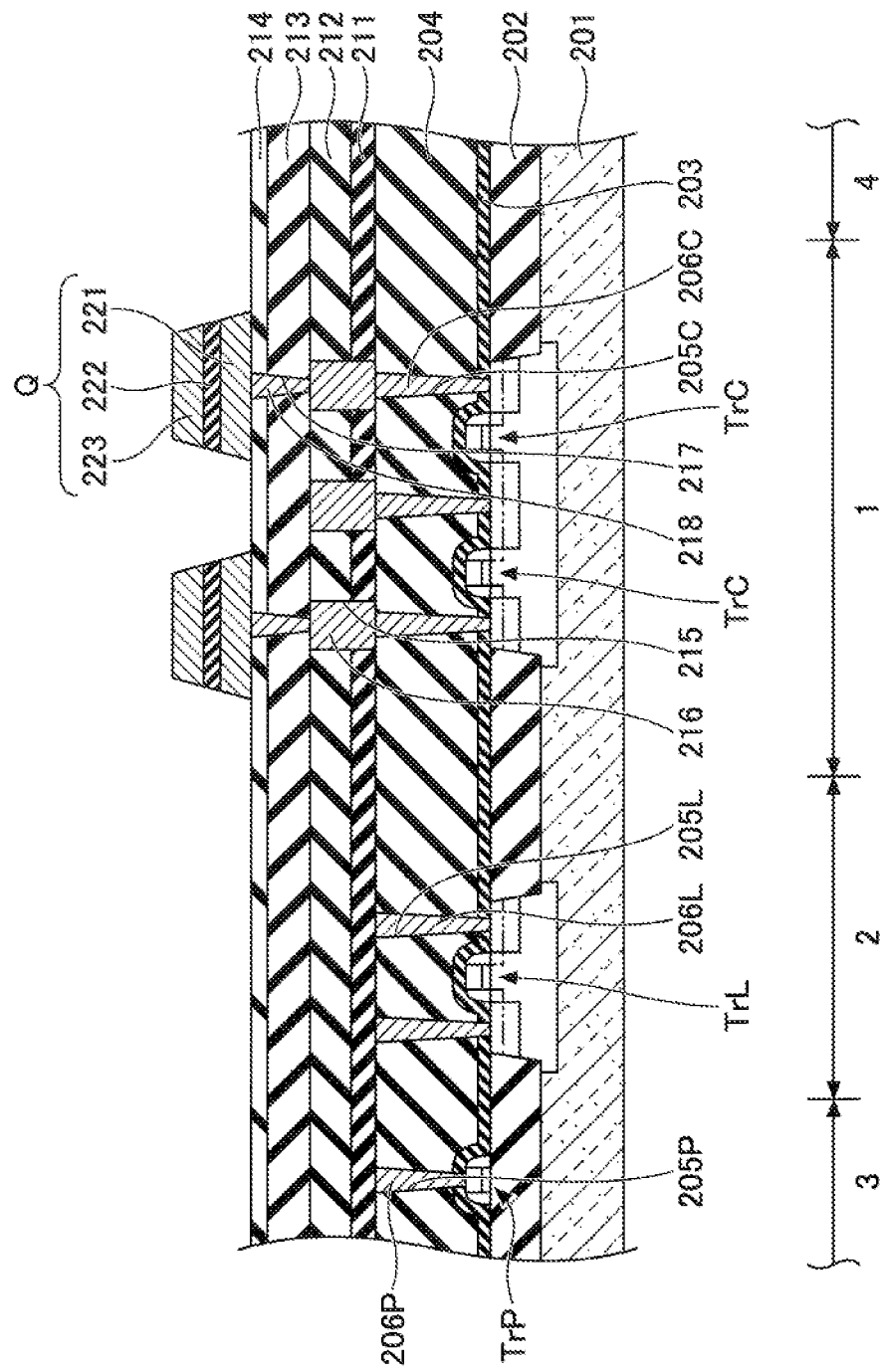

Subsequently, as illustrated in FIG. 8N, a resist pattern 257 is formed on the insulating film 225. The resist pattern 257 covers planned ferroelectric capacitor formation regions, and exposes the remaining portions. Subsequently, using the resist pattern 257 as a mask, the insulating film 225, the hard mask 224, the upper electrode 223, the ferroelectric film 222, and the lower electrode 221 are etched. As a result, a ferroelectric capacitors Q are formed.

Thereafter, as illustrated in FIG. 8O, the resist pattern 257, the insulating film 225, and the hard mask 224 are removed, and surfaces of the ferroelectric capacitors Q are cleaned using, for example, a scrubber.

Figure 8P:
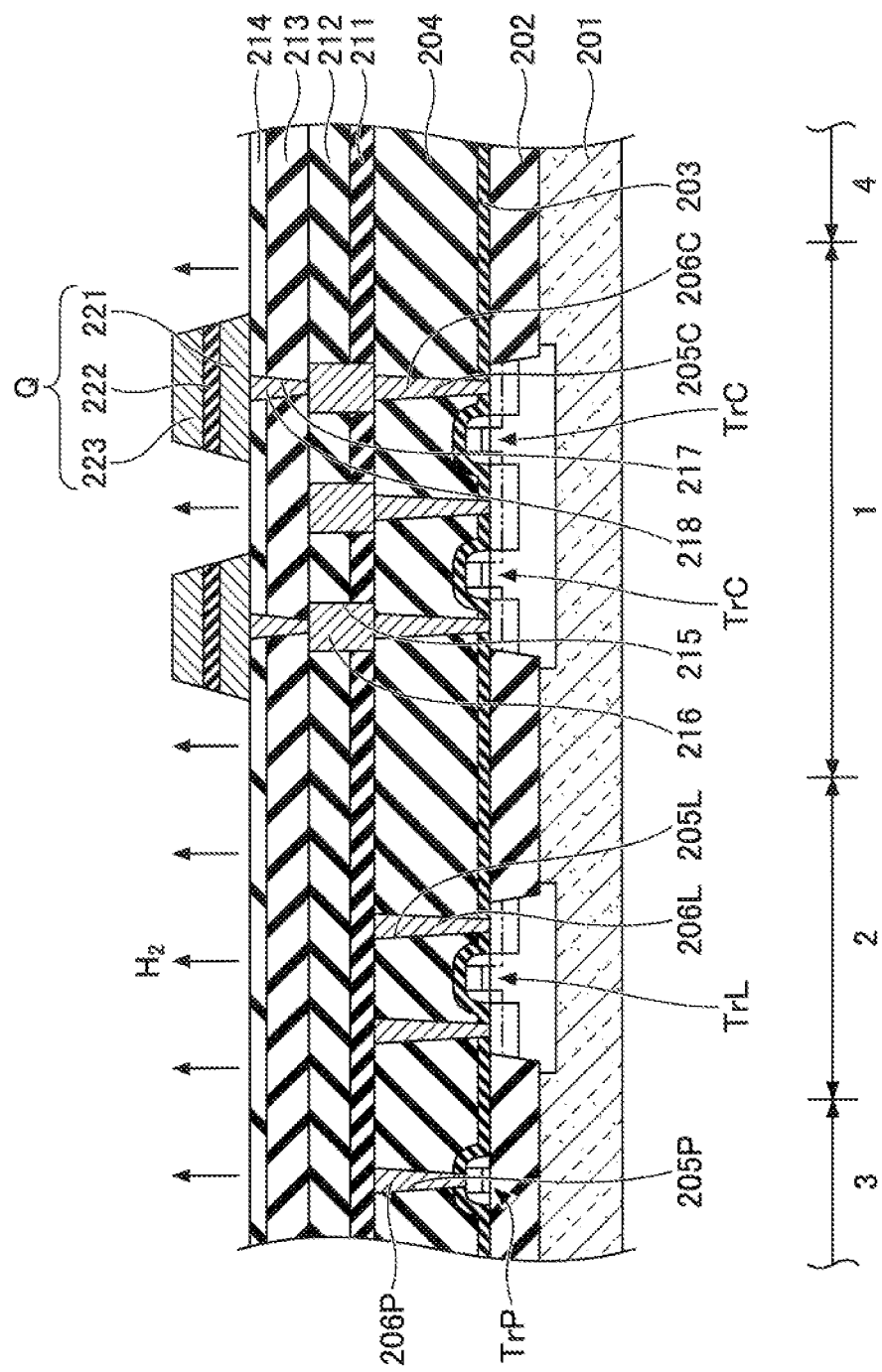
FIG. 8P is a cross-sectional view (part 16) illustrating the method for fabricating a semiconductor device according to the second embodiment.

Subsequently, recovery annealing is performed under an oxygen atmosphere in order to rectify oxygen deficiencies occurring in the ferroelectric film 222. For example, a recovery annealing temperature may be 300° C. to 400° C., and a recovery annealing time may be 30 minutes to 60 minutes. In this recovery annealing, oxygen deficiencies are rectified, and as illustrated in FIG. 8P, hydrogen generated by decomposition of water in the interlayer insulating film 212 and hydrogen generated by decomposition of water in the interlayer insulating film 214 are eliminated. In addition, since the oxidation preventing film 213 and the oxidation preventing film 211 prevent oxygen from penetrating, the penetration of oxygen below the oxidation preventing film 213 and the oxidation preventing film 211 is prevented. Oxidation of the conductive plugs 206C, the wirings 216, and the like is prevented as a result.

Figure 8Q:
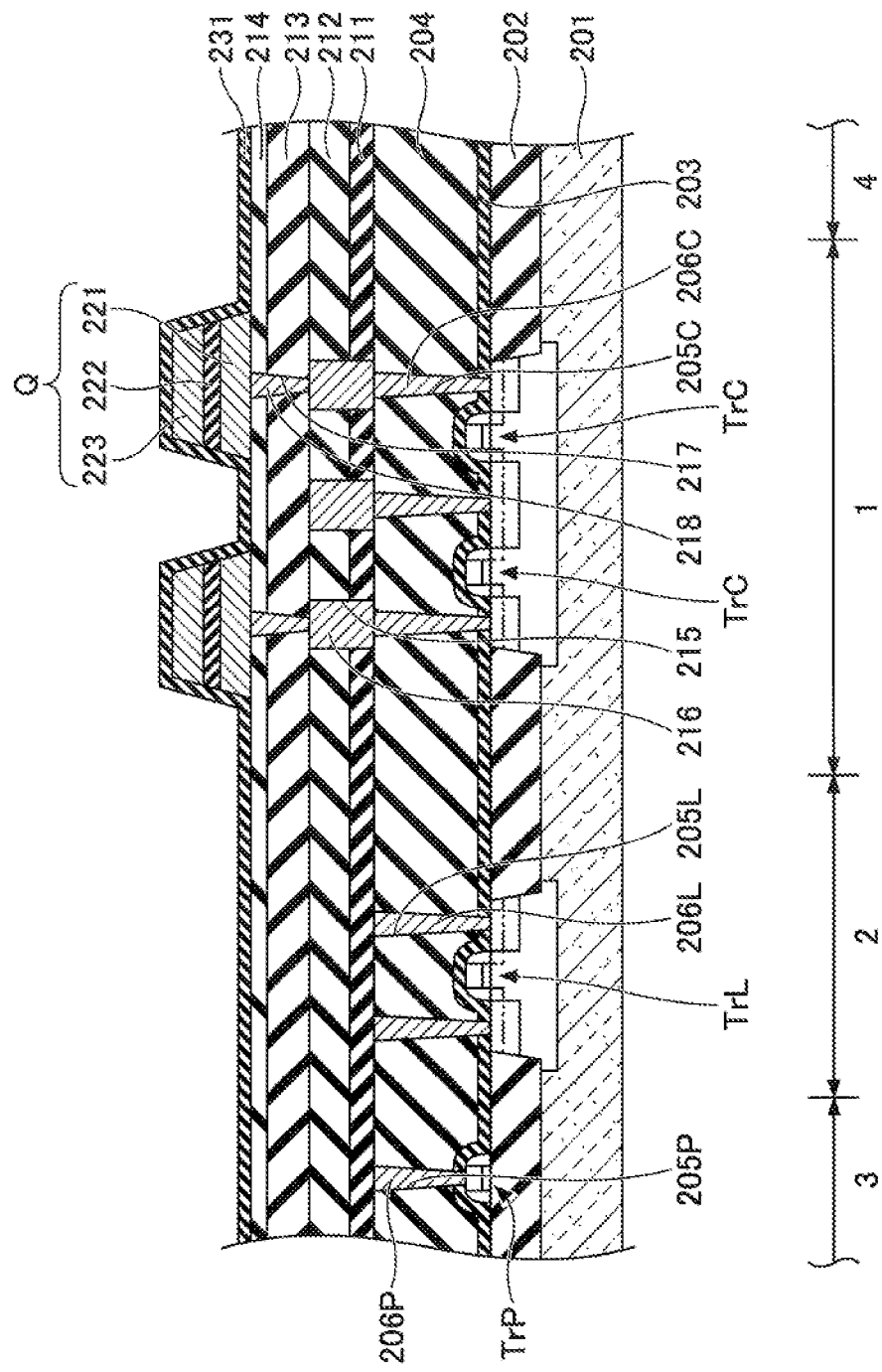
FIG. 8Q is a cross-sectional view (part 17) illustrating the method for fabricating a semiconductor device according to the second embodiment.

Next, as illustrated in FIG. 8Q, a barrier film 231 covering the upper surface and side surfaces of each of ferroelectric capacitors Q is formed. As the barrier film 231, an aluminum oxide ($AlO_x$) film having a thickness of 10 nm to 30 nm that is formed by a PVD method or a CVD method may be used, for example.

Thereafter, as illustrated in FIG. 8R, an interlayer insulating film 232 is formed on the barrier film 231, and a surface of the interlayer insulating film 232 is planarized. As the interlayer insulating film 232, a silicon oxide film having a thickness of 1200 nm to 1800 nm that is formed by a plasma CVD method using TEOS may be used, for example. In the planarization of the surface of the interlayer insulating film 232, the surface of the interlayer insulating film 232 is polished by a CMP method.

Figure 8S:
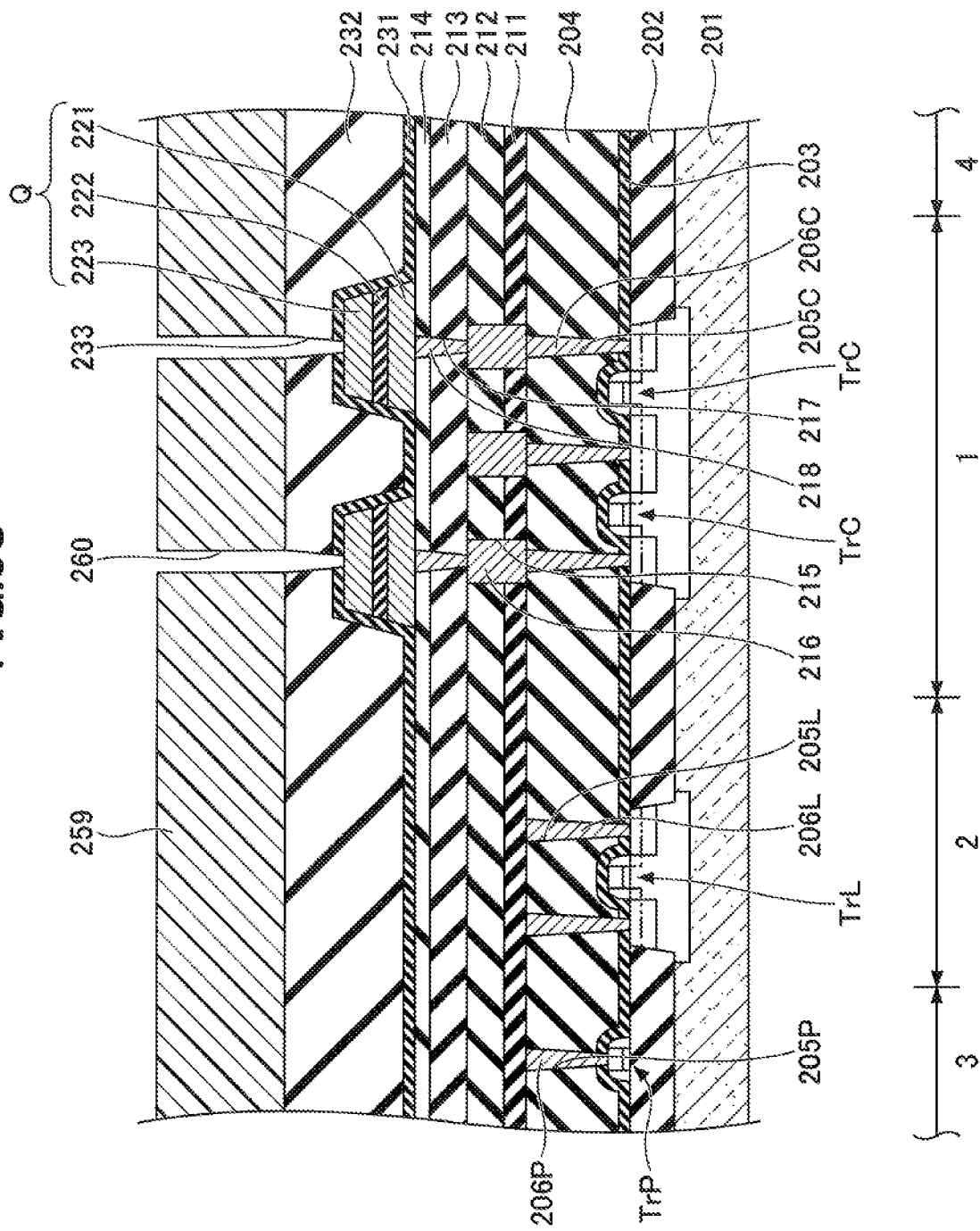
FIG. 8S is a cross-sectional view (part 19) illustrating the method for fabricating a semiconductor device according to the second embodiment.

Subsequently, as illustrated in FIG. 8S, a resist pattern 259 is formed on the interlayer insulating film 232. The resist pattern 259 has opening portions 260 that expose planned via hole formation regions in the memory cell portion 1. Subsequently, the interlayer insulating film 232 and the barrier film 231 are etched using the resist pattern 259 as a mask. As a result, opening portions (via holes) 233 are formed in the memory cell portion 1.

Figure 8T:
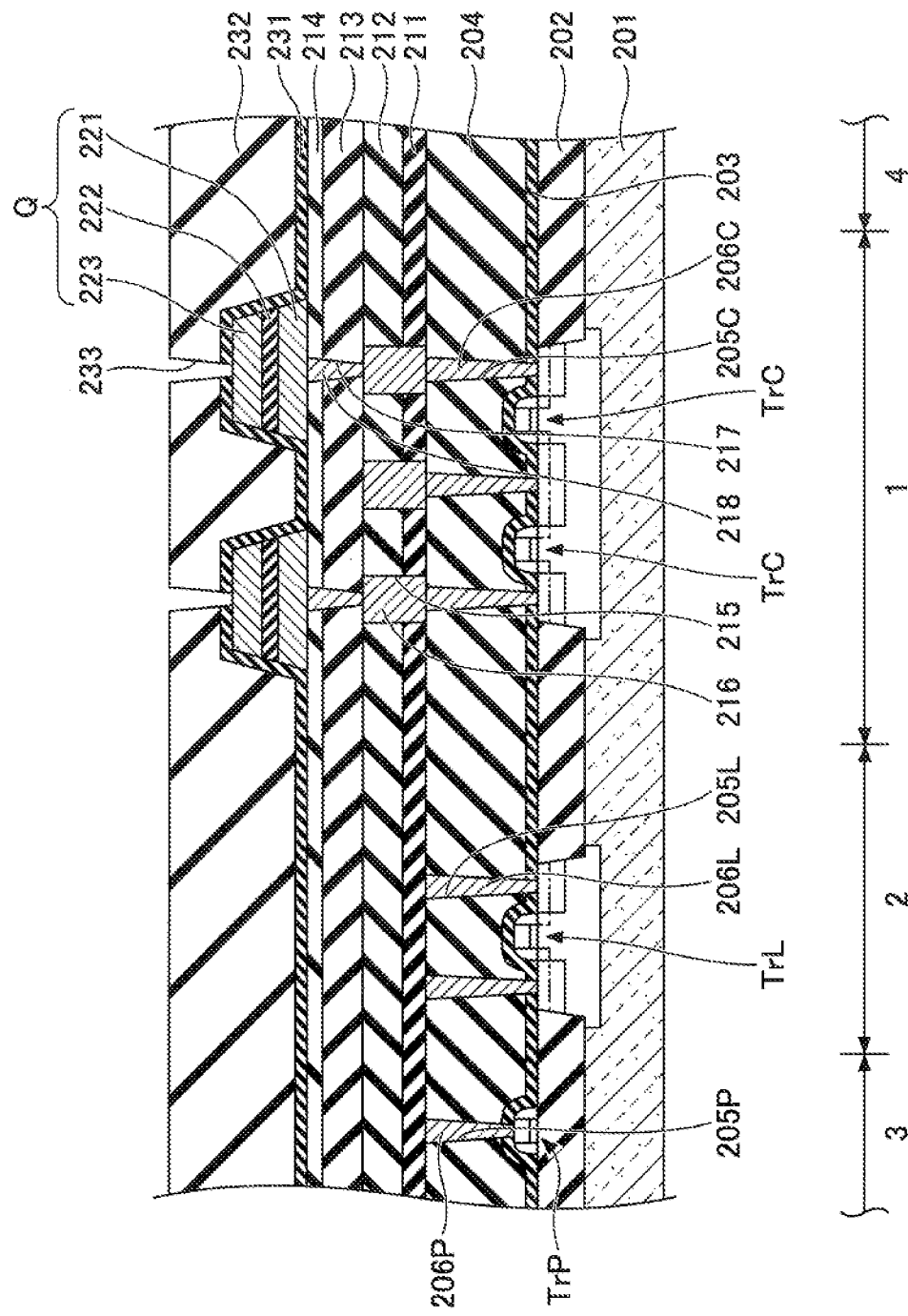
FIG. 8T is a cross-sectional view (part 20) illustrating the method for fabricating a semiconductor device according to the second embodiment.

Next, as illustrated in FIG. 8T, the resist pattern 259 is removed.

Figure 8U:
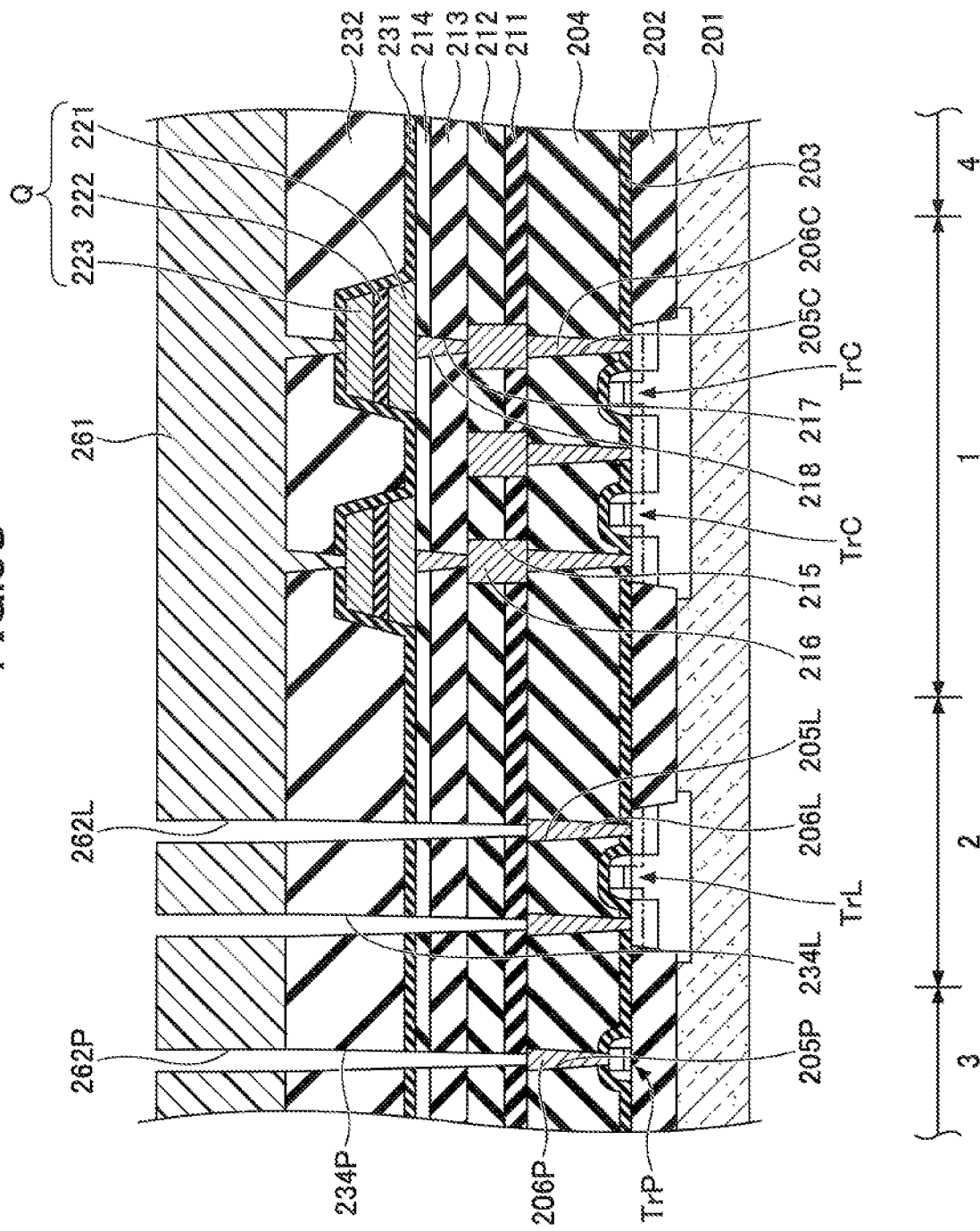
FIG. 8U is a cross-sectional view (part 21) illustrating the method for fabricating a semiconductor device according to the second embodiment.

Thereafter, as illustrated in FIG. 8U, a resist pattern 261 is formed on the interlayer insulating film 232 and also inside the opening portions 233. The resist pattern 261 includes opening portions 262L that expose planned via hole formation regions in the logic circuit portion 2, and an opening portion 262P that exposes a planned via hole formation region in the peripheral circuit portion 3. Subsequently, the interlayer insulating film 232, the barrier film 231, the interlayer insulating film 214, the oxidation preventing film 213, the interlayer insulating film 212, and the oxidation preventing film 211 are etched using the resist pattern 261 as a mask. As a result, opening portions (via holes) 234L are formed in the logic circuit portion 2, and an opening portion (via hole) 234P is formed in the peripheral circuit portion 3.

Figure 8V:
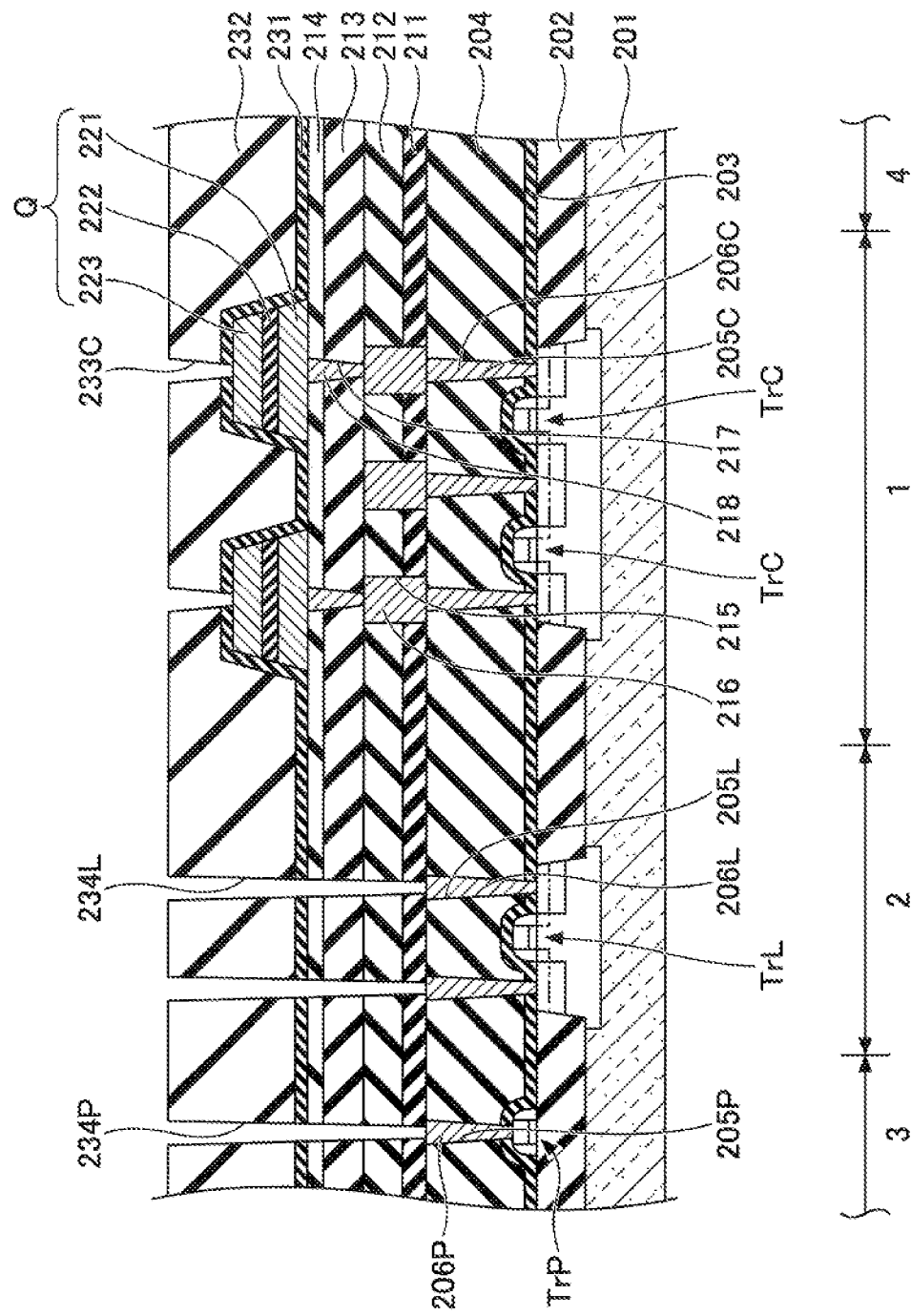
FIG. 8V is a cross-sectional view (part 22) illustrating the method for fabricating a semiconductor device according to the second embodiment.

Subsequently, as illustrated in FIG. 8V, the resist pattern 261 is removed.

Figure 8W:
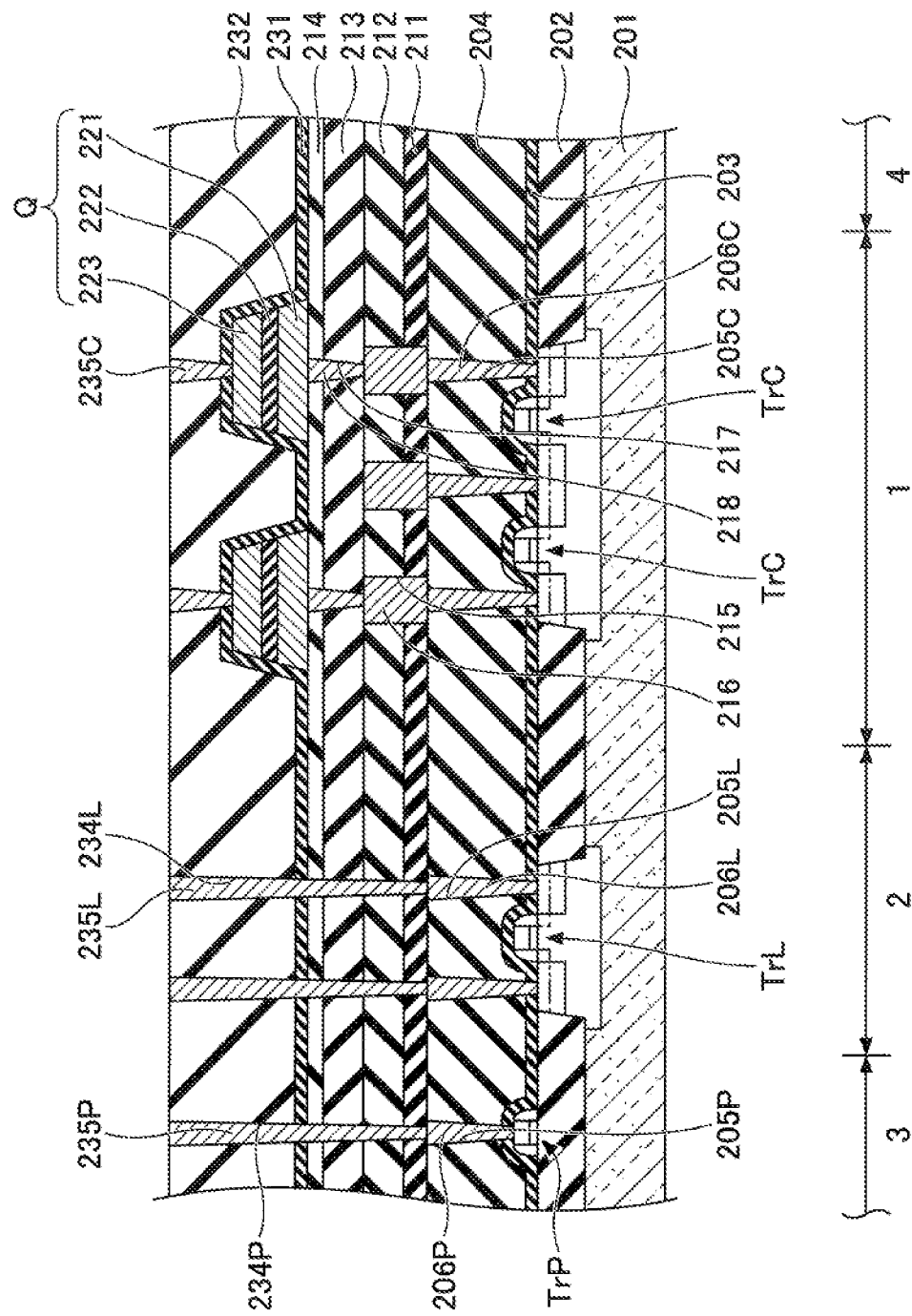
FIG. 8W is a cross-sectional view (part 23) illustrating the method for fabricating a semiconductor device according to the second embodiment.

Thereafter, as illustrated in FIG. 8W, conductive plugs 235C are formed in the opening portions 233, conductive plugs 235L are formed in the opening portions 234L, and a conductive plug 235P is formed in the opening portion 234P. The formation of the conductive plugs 235C, the conductive plugs 235L and the conductive plug 235P may, for example, include: forming a TiN film as a barrier metal film by a PVD method; forming a W film on the barrier metal film by the CVD method; and removing the TiN film and the W film on the interlayer insulating film 232. The thickness of the TiN film is 80 nm to 120 nm, and the thickness of the W film is 240 nm to 360 nm. The TiN film and the W film on the interlayer insulating film 232 may be removed by a CMP method, for example.

Figure 8X:
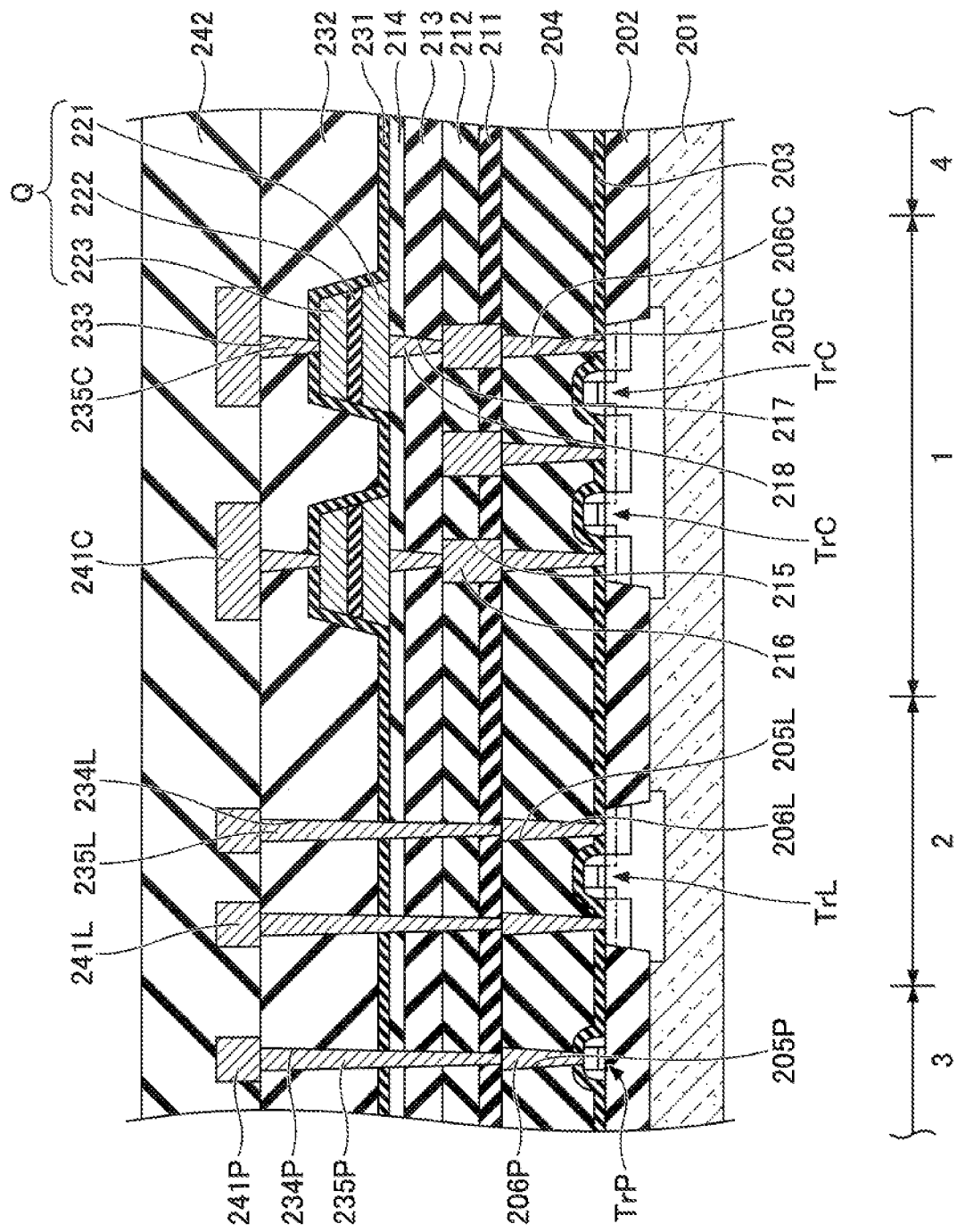
FIG. 8X is a cross-sectional view (part 24) illustrating the method for fabricating a semiconductor device according to the second embodiment.

Subsequently, as illustrated in FIG. 8X, wirings 241C are formed on the conductive plugs 235C, wirings 241L are formed on the conductive plugs 235L, and a wiring 241P is formed on the conductive plug 235P. Subsequently, an interlayer insulating film 242 covering the wirings 241C, the wirings 241L, and the wiring 241P is formed, and a surface of the interlayer insulating film 242 is planarized.

Further, upper layer wirings, pads, and the like are formed to complete the semiconductor device 200.

In the semiconductor device 200, since the oxidation preventing film 211 has the lowest hydrogen permeability among the oxidation preventing film 211, the interlayer insulating film 212, the oxidation preventing film 213, and the interlayer insulating film 214, as described above, hydrogen generated in the interlayer insulating film 212 and hydrogen generated in the interlayer insulating film 214 are released upward above the interlayer insulating film 214. Thus, even upon exposure to a temperature, at which moisture is decomposed at the time of forming the upper layer wirings or the like after the formation of the barrier film 231, deterioration of the ferroelectric capacitors Q due to moisture contained in the interlayer insulating film 212 and the interlayer insulating film 214 during film formation will hardly occur. In addition, deterioration of the ferroelectric capacitor Q due to long-term use will also hardly occur. Thus, it is possible to further reduce deterioration of the ferroelectric capacitor Q due to hydrogen.

Hydrogen contained in the interlayer insulating film 212 may be desorbed by annealing after the forming of the interlayer insulating film 212 and before the forming of the oxidation preventing film 213. Thus, hydrogen generated in the interlayer insulating film 212 may further be reduced, which may further reduce deterioration of the ferroelectric capacitor Q.

Note that moisture is also contained in the interlayer insulating film 204; however, this moisture may be decomposed during recovery annealing to allow hydrogen to be desorbed via the wiring 216. Even when moisture remains in the interlayer insulating film 212 after the recovery annealing, a distance between the interlayer insulating film 212 and the ferroelectric capacitor Q is large, such that any moisture remaining in the interlayer insulating film 212 will not cause deterioration of the ferroelectric capacitor Q.

In addition, the lower the nitrogen content, the more easily the silicon nitride film contains oxygen atoms; etching selectivity (i.e., ratio of etching rates) of the silicon nitride film and the silicon oxide film thus becomes small. Hence, the etching selectivity for forming the opening portions 215 in the oxidation preventing film 211 is higher than the etching selectivity for forming the opening portions 217 in the oxidation preventing film 213. In the second embodiment, since the oxidation preventing film 211 does not need to permeate hydrogen, a nitrogen content of a silicon nitride film that is higher than that of the oxidation preventing film 213 is used in the oxidation preventing film 211, in consideration of processing accuracy of the opening portions 215.

Figure 9:
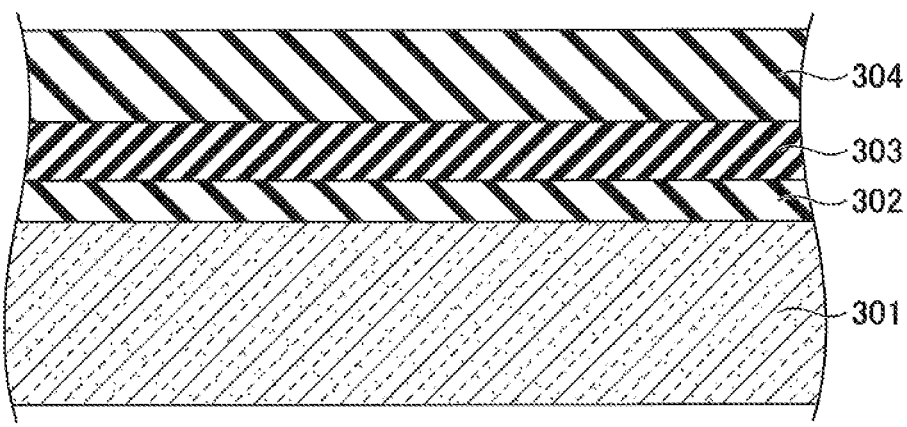
FIG. 9 is a cross-sectional view illustrating a sample used in an experiment.

The following illustrates an experiment conducted on a relationship between the nitrogen content and permeability of hydrogen in the silicon nitride film. FIG. 9 is a cross-sectional view illustrating a sample used in the experiment.

In this experiment, two samples were used; each sample was prepared by forming a silicon oxide film 302 on a silicon substrate 301, forming a silicon nitride film 303 on the silicon oxide film 302, and forming a silicon oxide film 304 on the silicon nitride film 303, as illustrated in FIG. 9. In this experiment, the conditions for forming the silicon oxide film 302 and the silicon oxide film 304 were the same between the two samples, and the conditions for forming the silicon nitride film 303 were differentiated between the two samples. In the first sample, a N/Si ratio (atomic ratio) of a supply amount of N atoms to a supply amount of Si atoms when forming the silicon nitride film 303 was set to 142. In the second sample, a N/Si ratio (atomic ratio) of a supply amount of N atoms to a supply amount of Si atoms when forming the silicon nitride film 303 was set to 211. Specifically, in the first sample, the flow rate of $SiH_4$ was 155 sccm and the flow rate of $NH_3$ was 900 for forming the silicon nitride film 303; and in the second sample, the flow rate of SiH was 480 sccm and the flow rate of $NH_3$ was 3850 for forming the silicon nitride film 303. Then, annealing was performed at 350° C. for 40 minutes under an oxygen atmosphere, and hydrogen concentrations in the silicon oxide film 302, the silicon nitride film 303, and the silicon oxide film 304 were measured by a secondary ion mass spectrometry (SIMS) method before and after the annealing.

Figure 10A:
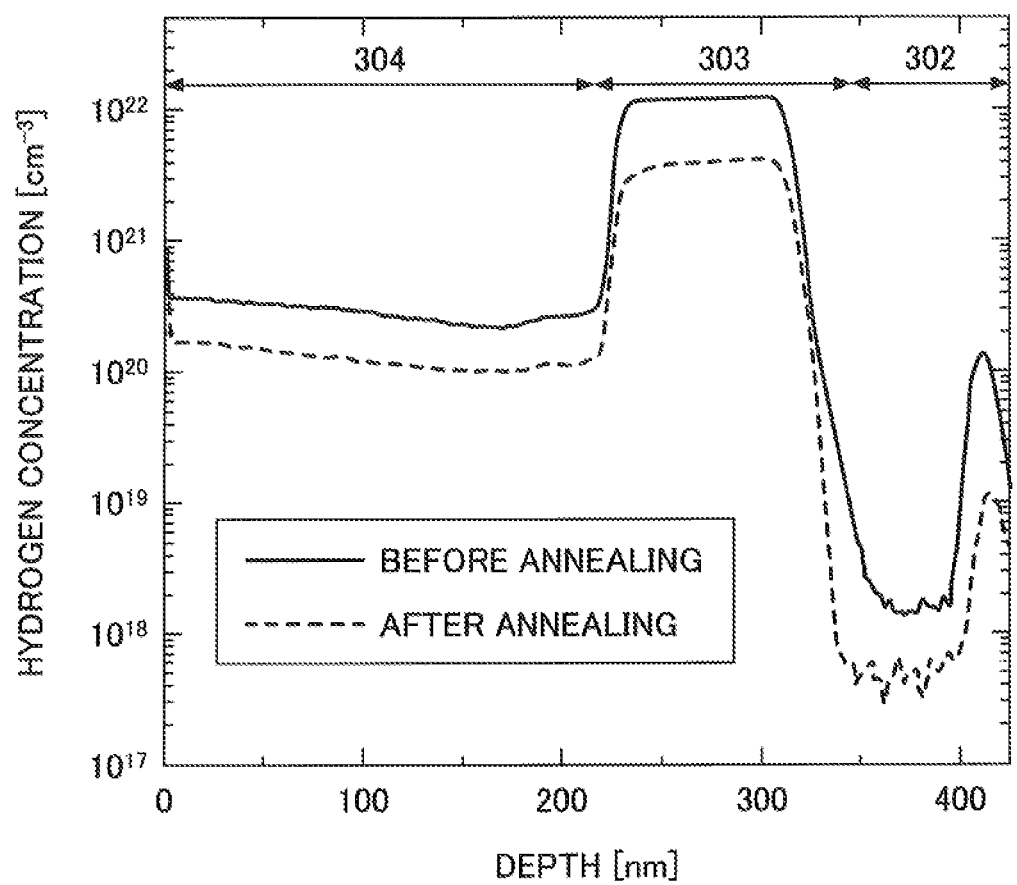
FIG. 10A is a diagram (part 1) illustrating experimental results.
Figure 10B:
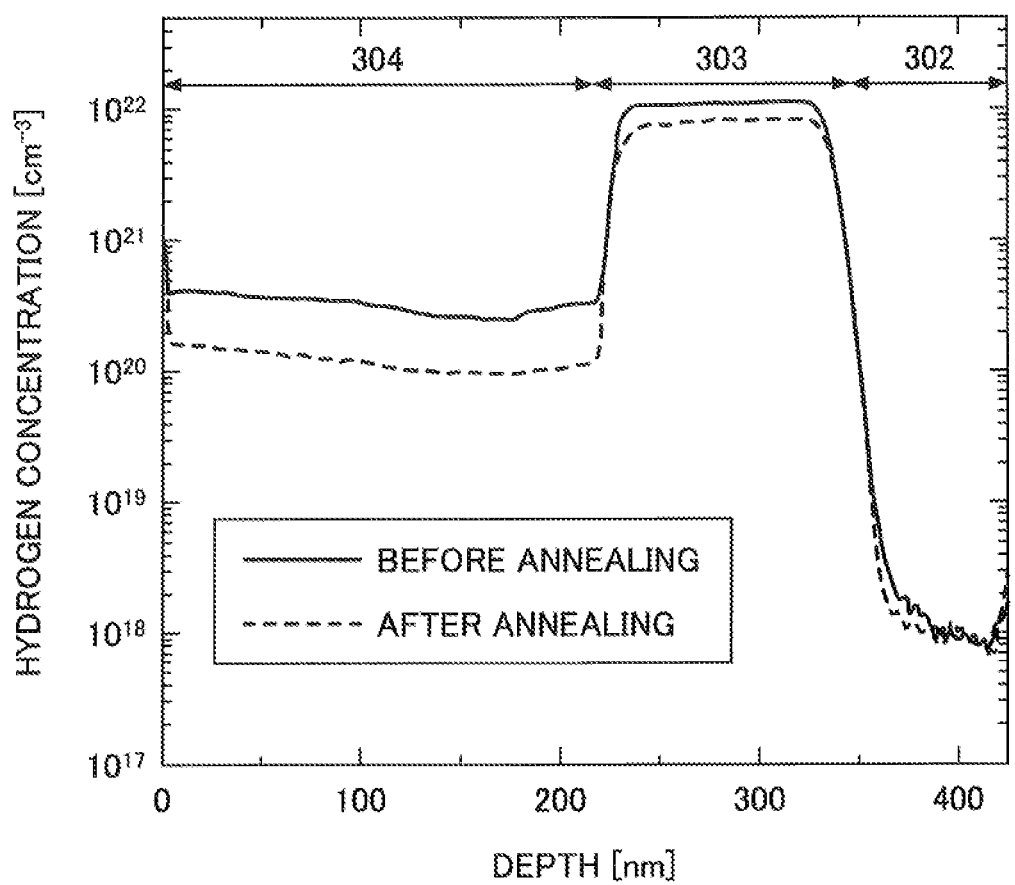
FIG. 10B is a diagram (part 2) illustrating experimental results.

FIG. 10A illustrates experimental results of the first sample, and FIG. 10B illustrates experimental results of the second sample. The horizontal axis in FIGS. 10A and 10B indicates the depth from the surface of the silicon oxide film 304. As illustrated in FIG. 10A, for the first sample, the hydrogen concentration after annealing was largely lowered compared to that before annealing in all of the silicon oxide film 302, the silicon nitride film 303, and the silicon oxide film 304. For the second sample, the hydrogen concentration after annealing was largely lowered compared to the hydrogen concentration before annealing in the silicon oxide film 304; however, in the silicon nitride film 303 and the silicon oxide film 302, the hydrogen concentration after annealing was hardly lowered compared to the hydrogen concentration before annealing. These results indicate that a hydrogen permeability of the silicon nitride film 303 of the first sample was higher than a hydrogen permeability of the silicon nitride film 303 of the second sample, so that the silicon nitride film 303 of the first sample is suitable for the oxidation preventing film 213, and the silicon nitride film 303 of the second sample is suitable for the oxidation preventing film 211.

Advantageous Effect

According to the disclosed technology, it is possible to further lower deterioration of a ferroelectric capacitor due to hydrogen.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   a substrate;
   a transistor formed on a surface of the substrate;
   a first insulating film formed above the transistor;
   a second insulating film formed on the first insulating film;
   a third insulating film formed on the second insulating film;
   a fourth insulating film formed on the third insulating film; and
   a ferroelectric capacitor formed on the fourth insulating film,
   wherein a hydrogen permeability of the third insulating film is higher than a hydrogen permeability of the first insulating film,
   wherein a hydrogen permeability and an oxygen permeability of the second insulating film and of the fourth insulating film are higher than the hydrogen permeability and an oxygen permeability of the first insulating film and of the third insulating film and
   wherein the first insulating film is a first silicon nitride film, and the third insulating film is a second silicon nitride film, a nitrogen content of the second silicon nitride film being lower than a nitrogen content of the first silicon nitride film.

2. The semiconductor device as claimed in claim 1, wherein an analysis conducted by X-ray photoelectron spectroscopy indicates that a Si—O bond peak of the third insulating film is greater than a Si—O bond peak of the first insulating film.

3. The semiconductor device as claimed in claim 1, further comprising:
   a fifth insulating film,
   wherein the fifth insulating film is formed on the fourth insulating film,
   the fifth insulating film covers an upper surface and side surfaces of the ferroelectric capacitor,
   a hydrogen permeability of the fifth insulating film is lower than the hydrogen permeability of the third insulating film, and
   an oxygen permeability of the fifth insulating film is lower than the oxygen permeability of the second insulating film and of the fourth insulating film.

4. The semiconductor device as claimed in claim 3, wherein the fifth insulating film is an aluminum nitride film.

5. The semiconductor device as claimed in claim 1, further comprising:
   a first conductor formed in the first insulating film and in the second insulating film;
   a second conductor formed in the third insulating film and in the fourth insulating film, the second conductor being connected to the first conductor and to the ferroelectric capacitor; and
   a third conductor in contact with a lower surface of the first conductor, the third conductor being connected to the transistor.

6. The semiconductor device as claimed in claim 5, further comprising:
   a fourth conductor formed in the first insulating film and in the second insulating film; and
   a fifth conductor in contact with a lower surface of the fourth conductor, and connected to the transistor.

7. The semiconductor device as claimed in claim 1, wherein the first insulating film and the third insulating film are provided over the entire semiconductor device in plan view.

8. A method for fabricating a semiconductor device, the method comprising:
   forming a transistor on a surface of a substrate;
   forming a first insulating film above the transistor;
   forming a second insulating film on the first insulating film, a hydrogen permeability and an oxygen permeability of the second insulating film being higher than a hydrogen permeability and an oxygen permeability of the first insulating film;
   forming a third insulating film on the second insulating film, a hydrogen permeability of the third insulating film being higher than the hydrogen permeability of the first insulating film, and the hydrogen permeability and an oxygen permeability of the third insulating film being lower than the hydrogen permeability and the oxygen permeability of the second insulating film;
   forming a fourth insulating film on the third insulating film, a hydrogen permeability and an oxygen permeability of the fourth insulating film being higher than the hydrogen permeability and the oxygen permeability of the first insulating film and of the third insulating film;
   forming a ferroelectric capacitor on the fourth insulating film; and
   performing annealing to desorb hydrogen contained in the second insulating film and in the fourth insulating film,
   wherein the first insulating film is a first silicon nitride film, and the third insulating film is a second silicon nitride film, a nitrogen content of the second silicon nitride film being lower than a nitrogen content of the first silicon nitride film.

9. The method as claimed in claim 8,
   wherein a first N/Si ratio indicates a ratio of a supply amount of nitrogen atoms to a supply amount of silicon atoms in the forming of the first insulating film,
   a second N/Si ratio indicates a ratio of a supply amount of nitrogen atoms to a supply amount of silicon atoms in the forming of the third insulating film, and
   the second N/Si ratio is lower than the first N/Si ratio.

10. The method as claimed in claim 8, further comprising:
    forming a fifth insulating film on the fourth insulating film,
    wherein the fifth insulating film covers an upper surface and side surfaces of the ferroelectric capacitor, a hydrogen permeability of the fifth insulating film is lower than the hydrogen permeability of the third insulating film, and an oxygen permeability of the fifth insulating film is lower than the oxygen permeability of the second insulating film and of the fourth insulating film.

11. The method as claimed in claim 10, wherein the fifth insulating film is an aluminum nitride film.

12. The method as claimed in claim 8, further comprising:

performing annealing between the forming of the second insulating film and the forming of the third insulating film to desorb hydrogen contained in the second insulating film.

* * * * *